United States Patent [19]
Shigemori et al.

[11] Patent Number: 6,081,164
[45] Date of Patent: Jun. 27, 2000

[54] PLL OSCILLATOR PACKAGE AND PRODUCTION METHOD THEREOF

[75] Inventors: Mikio Shigemori, Los Gatos, Calif.; Hideo Karasawa, Suwa, Japan

[73] Assignee: Seiko Epson Corporation, Tokyo, Japan

[21] Appl. No.: 08/930,861

[22] PCT Filed: Jan. 9, 1997

[86] PCT No.: PCT/JP97/00019

§ 371 Date: Oct. 7, 1997

§ 102(e) Date: Oct. 7, 1997

[87] PCT Pub. No.: WO98/31104

PCT Pub. Date: Jul. 16, 1998

[51] Int. Cl.[7] .......................... H01L 23/50; H01L 25/16; H03L 7/18
[52] U.S. Cl. ................... 331/16; 331/25; 331/34; 331/36 C; 331/68; 331/158; 331/177 R
[58] Field of Search .................. 331/16, 25, 34, 331/36 C, 68, 158, 177 R

[56] References Cited

U.S. PATENT DOCUMENTS

| | | | |
|---|---|---|---|
| 5,307,034 | 4/1994 | Morita et al. | 333/187 |
| 5,451,912 | 9/1995 | Torode | 331/108 C |
| 5,500,628 | 3/1996 | Knecht | 331/176 |
| 5,608,770 | 3/1997 | Noguchi et al. | 377/47 |
| 5,631,609 | 5/1997 | Oka et al. | 331/68 |
| 5,703,540 | 12/1997 | Gazda et al. | 331/16 |
| 5,877,657 | 3/1999 | Yoshinaka . | |

FOREIGN PATENT DOCUMENTS

| | | |
|---|---|---|
| B2 52-47982 | 12/1977 | Japan . |
| 58-165412 | 9/1983 | Japan . |
| 60-191521 | 9/1985 | Japan . |
| 3-76427 | 4/1991 | Japan . |
| 4-138702 | 5/1992 | Japan . |
| 4-335704 | 11/1992 | Japan . |
| 4-351107 | 12/1992 | Japan . |
| 5-75343 | 3/1993 | Japan . |
| 6-152245 | 5/1994 | Japan . |
| 7-212130 | 8/1995 | Japan . |
| 7-263961 | 10/1995 | Japan . |
| 8-23252 | 1/1996 | Japan . |
| 8-97712 | 4/1996 | Japan . |

*Primary Examiner*—Siegfried H. Grimm
*Attorney, Agent, or Firm*—Oliff & Berridge, PLC

[57] ABSTRACT

A PLL (phase locked loop) oscillator suitable as a clock signal source for use in a computer system or the like includes a piezoelectric resonator, an oscillating circuit for generating an oscillating signal in cooperation with the piezoelectric resonator, and a PLL circuit which operates using the oscillating signal generated by the oscillating circuit as a reference signal, all these elements being housed in a package, the frequency of the output signal of the PLL oscillator being determined by the oscillation frequency of the oscillating circuit and the frequency dividing ratio of a programmable frequency divider in the PLL circuit, wherein the frequency dividing ratio of the programmable frequency divider is set by writing the data representing the frequency dividing ratio into a programmable read only memory thereby setting the output frequency to a desired value.

36 Claims, 22 Drawing Sheets

FIG.2

| FREQUENCY SELECTION TERMINALS | | | | FREQUENCY DIVIDING RATIOS | | | OUTPUT FREQUENCY | ACTUAL OUTPUT FREQUENCY |
|---|---|---|---|---|---|---|---|---|
| S3 | S2 | S1 | S0 | M | N | X | (MHz) | (MHz) |
| H | H | H | H | 1 | 3662 | 2 | 60.000 | 59.998 |
| H | H | H | L | 1 | 4069 | 2 | 66.667 | 66.666 |
| H | H | L | H | 1 | 1800 | 32 | 1.8432 | 1.8432 |
| H | H | L | L | 1 | 1748 | 4 | 14.318 | 14.320 |
| H | L | H | H | 1 | 2442 | 4 | 20.000 | 20.005 |
| H | L | H | L | 1 | 1526 | 2 | 25.000 | 25.002 |
| H | L | L | H | 1 | 1953 | 4 | 16.000 | 15.999 |
| H | L | L | L | 1 | 2700 | 4 | 22.118 | 22.118 |
| L | H | H | H | 1 | 2441 | 2 | 40.000 | 39.993 |
| L | H | H | L | 1 | 3052 | 2 | 50.000 | 50.004 |
| L | H | L | H | 1 | 2930 | 4 | 24.000 | 24.003 |
| L | H | L | L | 1 | 1953 | 2 | 32.000 | 31.998 |
| L | L | H | H | 1 | 4883 | 2 | 80.000 | 80.003 |
| L | L | H | L | 1 | 6104 | 2 | 100.00 | 100.01 |
| L | L | L | H | 1 | 2034 | 2 | 33.333 | 33.325 |
| L | L | L | L | 1 | 2930 | 2 | 48.000 | 48.005 |

FREQUENCY OF QUARTZ RESONATOR : fc=32.768 KHz

| FREQUENCY SELECTION TERMINAL | | | | FREQUENCY DIVIDING RATIOS | | | OUTPUT FREQUENCY |
|---|---|---|---|---|---|---|---|
| S3 | S2 | S1 | S0 | M | N | X | (MHz) |
| H | H | H | H | 5 | 8 | 2 | 16.000 |
| H | H | H | L | 4 | 8 | 2 | 20.000 |
| H | H | L | H | 2 | 8 | 2 | 40.000 |
| H | H | L | L | 1 | 8 | 2 | 80.000 |
| H | L | H | H | 5 | 16 | 2 | 32.000 |
| H | L | H | L | 4 | 10 | 2 | 25.000 |
| H | L | L | H | 2 | 10 | 2 | 50.000 |
| H | L | L | L | 1 | 10 | 2 | 100.00 |
| L | H | H | H | 1 | 9 | 2 | 90.000 |
| L | H | H | L | 4 | 12 | 2 | 30.000 |
| L | H | L | H | 2 | 12 | 2 | 60.000 |
| L | H | L | L | 1 | 12 | 2 | 120.000 |
| L | L | H | H | 3 | 40 | 2 | 133.33 |
| L | L | H | L | 3 | 10 | 2 | 33.333 |
| L | L | L | H | 3 | 20 | 2 | 66.667 |
| L | L | L | L | 2 | 15 | 2 | 75.000 |

FREQUENCY OF QUARTZ RESONATOR : fc=20MHz

FIG.3

| FREQUENCY SELECTION TERMINALS | | | | FREQUENCY DIVIDING RATIOS | | | FREQUENCY MULTIPLICATION FACTOR | FREQUENCY OF QUARTZ RESONATOR (MHz) | OUTPUT FREQUENCY (MHz) |
|---|---|---|---|---|---|---|---|---|---|
| S3 | S2 | S1 | S0 | M | N | X | | | |
| H | H | H | H | 4 | 12 | 2 | 1.5 | 24~26 | 36~39 |
| H | H | H | L | 4 | 13 | 2 | 1.625 | 24~25.85 | 39~42 |
| H | H | L | H | 4 | 14 | 2 | 1.75 | 24~25.71 | 42~45 |
| H | H | L | L | 4 | 15 | 2 | 1.875 | 24~25.6 | 45~48 |
| H | L | H | H | 2 | 8 | 2 | 2 | 24~27 | 48~54 |
| H | L | H | L | 2 | 9 | 2 | 2.25 | 24~26.67 | 54~60 |
| H | L | L | H | 2 | 10 | 2 | 2.5 | 24~26.4 | 60~66 |
| H | L | L | L | 2 | 11 | 2 | 2.75 | 24~26.18 | 66~72 |
| L | H | H | H | 2 | 12 | 2 | 3 | 24~26 | 72~78 |
| L | H | H | L | 2 | 13 | 2 | 3.25 | 24~25.85 | 78~94 |
| L | H | L | H | 2 | 14 | 2 | 3.5 | 24~25.71 | 84~90 |
| L | H | L | L | 2 | 15 | 2 | 3.75 | 24~25.6 | 90~96 |
| L | L | H | H | 1 | 8 | 2 | 4 | 24~27 | 96~108 |
| L | L | H | L | 1 | 9 | 2 | 4.5 | 24~26.67 | 108~120 |
| L | L | L | H | 1 | 10 | 2 | 5 | 24~26.4 | 120~132 |
| L | L | L | L | 1 | 11 | 2 | 5.5 | 24~25.46 | 132~140 |

FIG.4

| FREQUENCY SELECTION TERMINAL | | | | FREQUENCY DIVIDING RATIO | | | OUTPUT FREQUENCY |
|---|---|---|---|---|---|---|---|
| S3 | S2 | S1 | S0 | M | N | X | (MHz) |
| H | H | H | H | 2 | 10 | 2 | 50.000 |
| H | H | H | L | 10 | 55 | 2 | 55.000 |
| H | H | L | H | 2 | 12 | 2 | 60.000 |
| H | H | L | L | 10 | 66 | 2 | 66.000 |
| H | L | H | H | 3 | 20 | 2 | 66.667 |
| H | L | H | L | 10 | 73 | 2 | 73.000 |
| H | L | L | H | 2 | 15 | 2 | 75.000 |
| H | L | L | L | 10 | 83 | 2 | 83.000 |
| L | H | H | H | 2 | 16 | 2 | 80.000 |
| L | H | H | L | 10 | 88 | 2 | 88.000 |
| L | H | L | H | 1 | 9 | 2 | 90.000 |
| L | H | L | L | 10 | 99 | 2 | 99.000 |
| L | L | H | H | 1 | 10 | 2 | 100.00 |
| L | L | H | L | 10 | 110 | 2 | 110.00 |
| L | L | L | H | 1 | 25 | 2 | 125.00 |
| L | L | L | L | 10 | 138 | 2 | 138.00 |

FREQUENCY OF QUARTZ RESONATOR : fc=20MHz

FIG.7

| FUNCTION | QUARTZ OSCILLATOR | PLL CIRCUIT | OUTPUT |
|---|---|---|---|
| OE | IN OSCILLATION | IN OPERATION | IN HIGH-IMPEDANCE STATE |
| ST | IN OSCILLATION OR PAUSE | IN PAUSE | FIXED TO A PARTICULAR LEVEL |
| STZ | IN OSCILLATION OR PAUSE | IN PAUSE | IN HIGH-IMPEDANCE STATE |

FIG.12

PLL OSCILLATOR PACKAGE AND PRODUCTION METHOD THEREOF

FIELD OF THE INVENTION

The present invention relates to a PLL oscillator and a piezoelectric oscillator, composed of a semiconductor integrated circuit and a piezoelectric resonator, for supplying a clock signal to a microcomputer or the like.

BACKGROUND TECHNOLOGY

Referring to FIG. 20, a first example of a conventional oscillator consisting of a semiconductor integrated circuit and a piezoelectric resonator for generating a clock signal to a computer or the like will be described below. A plurality of quartz oscillators 203 each including a piezoelectric resonator such as a quartz resonator 202 are mounted on a circuit board 201 of a computer system. Clock signals with various frequencies are generated by the respective quartz oscillators 203 and supplied to various units such as a CPU unit 204, an HDD unit 205, and communication units 206. Thus, the computer system needs as many quartz oscillators 203 as the number of clock frequencies. Furthermore, some units such as the CPU and HDD need a clock signal at a high frequency equal to or higher than 40 MHz. For such purpose, in the conventional technique, a clock signal is generated using a quartz oscillator operated in an overtone oscillation mode. FIG. 21 illustrates an example of a basic circuit of an overtone oscillator.

FIG. 22 illustrates a second example of a conventional PLL oscillator using a PLL circuit. This PLL oscillator includes an oscillation circuit coupled to a 14.31818-MHz quartz resonator for generating an oscillation signal and a PLL circuit which operates using the above oscillation signal as a reference signal. The frequency of the output signal is determined by the oscillation frequency of the quartz resonator and the frequency dividing ratio of a programmable frequency divider in the PLL circuit. The frequency dividing ratio of the programmable PLL frequency divider can be selected from two or more values so as to set the output frequency to a desired value.

Conventionally, a clock generator is realized using a quartz oscillator formed by combining a quartz resonator and an IC chip such as a CMOS IC chip. To generate a clock signal at a particularly high frequency supplied to a CPU, HDD, or the like, a quartz oscillator is operated in an overtone oscillation mode. However, the overtone oscillator circuit is difficult to operate in a stable fashion. More specifically, in the case of a 3rd-order overtone oscillator circuit, it is required that the circuit can selectively capture only a 3rd-order overtone signal while other signals at 1st- and 5th-order overtone frequencies should be suppressed. FIG. 23 illustrates a typical example of the negative resistance versus frequency characteristic of the overtone oscillator circuit. In FIG. 23, the curve 210 represents the characteristic of an oscillating circuit designed to operate at 50 MHz in the 3rd-order overtone mode. The negative resistance becomes maximum at 50 MHz corresponding to the 3rd-order overtone frequency, while the circuit has smaller negative resistances at 16.6 MHz corresponding to the 1st-order frequency and at 83.3 MHz corresponding to the 5th-order overtone frequency. As a result, oscillation occurs at 50 MHz corresponding to the 3rd-order overtone frequency. The negative resistance versus frequency characteristic varies depending on the gate capacitance (Cg), drain capacitance (Cd), feedback resistance (Rf), and the amplification factor (a) of an inverter. Therefore, if these parameters vary, the 3rd-order overtone oscillation can become unstable. As a result, even a jump to another order overtone mode can occur. More specifically, if the gate capacitance, drain capacitance, or feedback resistance increases, or the amplification factor of the inverter decreases, the negative resistance versus frequency characteristic shifts to left along the frequency axis This can cause a jump in oscillation to the fundamental frequency mode. On the other hand, if the gate capacitance, drain capacitance, or feedback resistance decreases, or the amplification factor of the inverter increases, the negative resistance versus frequency characteristic shifts to the right along the frequency axis, which can cause the oscillator to jump into the 5th-order overtone mode. Furthermore, the characteristics of each element of the oscillator have dependence on temperature and voltage. Therefore, the variations in temperature and/or voltage cause a change in the negative resistance versus frequency characteristic. In general, the negative resistance versus frequency characteristic shifts to the right along the frequency axis when the temperature is low and/or voltage is high, while the characteristic shifts to the left when the temperature is high and/or the voltage is low. This means that the overtone oscillator cannot be used in such environments in which large variations occur in the temperate and/or voltage. Furthermore, if the gate capacitance and/or drain capacitance are changed to adjust the oscillation frequency, a similar shift in the negative resistance versus frequency characteristic occurs, which can cause the 3rd-order overtone oscillation to become unstable and jump into another order overtone mode. Another disadvantage of the overtone oscillation is that the variable range of frequency is narrow compared to that of the fundamental frequency oscillation. Therefore, the overtone oscillation technique cannot be used in such applications in which a large variable frequency range is required.

In the second example of the PLL oscillator using a PLL circuit according to the conventional technique, the frequency is determined by the oscillation frequency of the quartz resonator, that is 14.31818 MHz in this specific example, and also by the frequency dividing ratio of a programmable frequency divider in the PLL circuit. The frequency dividing ratio of the programmable frequency divider is limited to integers, and thus there can be a difference between the actual frequency and a desired frequency. Therefore, if the application needs a high frequency accuracy, the PLL oscillator of this type cannot be employed. Another problem is that although the output frequency can be selected from 4 to 16 different preset values, other output frequencies are not available unless the frequency dividing ratio of the programmable frequency divider is redesigned. However, the implementation of the redesign requires a change in the aluminum pattern of the IC, which needs a long time and high cost.

Thus the general object of the present invention is to solve the above problems in the conventional techniques. It is a more specific object of the present invention to provide a PLL oscillator capable of generating a clock signal for use by a computer or the like at as high a frequency as 40 MHz or higher which cannot be easily generated by a quartz oscillator in a fundamental frequency mode, capable of operating in a stable fashion as the quartz oscillator in the fundamental frequency mode, capable of easily setting the output frequency to a desired value, capable of supplying it to a customer in a short delivery time (that is, capable of shipping it to a customer in a short time after receiving an order from the customer), capable of producing it at a low cost, capable of easily using it as the conventional quartz oscillator, and having a small size.

SUMMARY OF THE INVENTION

The present invention provides a PLL oscillator and a method of producing a PLL oscillator, having various aspects, features, and advantages as described below.

(1) The invention provides a PLL oscillator comprising a piezoelectric resonator, an oscillating circuit for generating an oscillating signal in cooperation with the piezoelectric resonator, a PLL (phase locked loop) circuit which operates using the oscillating signal generated by the oscillating circuit as a reference signal, all these elements being housed in a sealed package, and the frequency of the output signal of the PLL oscillator being determined by the oscillation frequency of the oscillating circuit and the frequency dividing ratio of a programmable frequency divider in the PLL circuit, the PLL oscillator being characterized in that it further comprises means for selecting the frequency dividing ratio of the programmable frequency divider so that the output frequency is set to a desired value.

(2) The invention provides a PLL oscillator based on the aspect (1), further comprising means for selecting the frequency dividing ratio of the programmable frequency divider and also selecting the resonance frequency of the piezoelectric resonator so that the output frequency is set to an arbitrary desired value.

(3) The invention provides a PLL oscillator based on the aspect (1), wherein a terminal serving as a frequency selection pad for selecting the frequency dividing ratio of the programmable frequency divider is provided on the PLL IC (integrated circuit), and the frequency selection pad is selectively connected via a bonded-wire to either a power supply conductor or a ground level conductor provided in the package so that the output frequency is set to a desired value.

(4) The invention provides a PLL oscillator based on the aspect (1), wherein the connection between the frequency selection pad and the conductor provided in the package is selectively disconnected so that the output frequency is set to a desired value.

(5) The invention provides a PLL oscillator based on the aspect (1), wherein a terminal serving as a frequency selection pad for selecting the frequency dividing ratio of the programmable frequency divider is provided on the PLL IC, and the frequency selection pad is connected via a bonded-wire to a lead terminal having a portion extending outside the package.

(6) The invention provides a PLL oscillator based on the aspect (5), wherein either one of two output frequencies is selected by controlling the frequency selection pad in which the ratio of the higher output frequency to the lower output frequency is within the range from 1.10 to 1.15.

(7) The invention provides a PLL oscillator based on the aspect (1), further comprising:

a frequency selection terminal for selecting the frequency dividing ratio of the programmable frequency divider; and a programmable read only memory for storing data by which the state of the frequency selection terminal is determined.

(8) The invention provides a PLL oscillator based on the aspect (7), wherein the frequency selection terminal has a portion extending outside the package, and the PLL oscillator further comprises means for writing d ata, by which the state of the frequency selection terminal is determined, into the programmable read only memory after placing the PLL IC and the piezoelectric resonator into the package in a sealed fashion.

(9) The invention provides a PLL oscillator based on the aspect (1), further comprising a programmable read only memory for storing the frequency dividing ratio associated with the programmable frequency divider, and means for writing the frequency dividing ratio into the programmable read only memory.

(10) The invention provides a PLL oscillator based on the aspect (9), further comprising means for writing the frequency dividing ratio into the programmable read only memory after placing the IC including the PLL circuit and the piezoelectric resonator in the package in a sealed fashion.

(11) The invention provides a PLL oscillator based on the aspect (10), wherein a terminal for writing the frequency dividing ratio is disposed on a side of the package, none of other terminals including an output enable terminal (OE terminal), ground terminal (GND terminal), output terminal (OUT terminal) and power supply terminal (VDD terminal) being disposed on the side.

(12) The invention provides a PLL oscillator based on the aspect (7), wherein the programmable read only memory is a fuse ROM.

(13) The invention provides a PLL oscillator based on the aspect (1), wherein the piezoelectric resonator is a fundamental frequency mode quartz resonator not formed in a convex shape.

(14) The invention provides a method of producing a PLL oscillator, comprising the steps of: preparing a PLL oscillator including a piezoelectric resonator, an oscillating circuit for generating an oscillating signal in cooperation with the piezoelectric resonator, a PLL circuit which operates using the oscillating signal provided from the oscillating circuit as a reference signal, a frequency selection terminal for selecting the frequency dividing ratio associated with a programmable frequency divider in the PLL circuit, a programmable read only memory for storing data by which the state of the frequency selection terminal is determined, and means for writing the data, all these elements being placed in a sealed package, the frequency selection terminal having a portion extending outside the package; and cutting off the frequency selection terminal after writing the data into the programmable read only memory.

(15) The invention provides a method of producing a PLL oscillator, comprising the steps of: preparing a PLL oscillator including a piezoelectric resonator, an oscillating circuit for generating an oscillating signal in cooperation with the piezoelectric resonator, a PLL circuit which operates using the oscillating signal provided from the oscillating circuit as a reference signal, a programmable read only memory for storing the frequency dividing ratio of a programmable frequency divider in the PLL circuit, and means for writing the frequency dividing ratio into the programmable read only memory, all these elements being placed in a sealed package, the PLL oscillator further including a writing terminal for writing the frequency dividing ratio, the writing terminal having a portion extending outside the package; and writing the frequency dividing ratio into the programmable read only memory via the writing terminal.

(16) The invention provides a method of producing a PLL oscillator, based on the aspect (15), wherein the frequency selection terminal is cut off after writing the frequency dividing ratio into the programmable read only memory.

(17) The invention provides a method of producing a PLL oscillator, based on the aspect (15), wherein after cutting off the writing terminal, a probe is placed such that it comes into contact with the cut surface of the writing terminal thereby writing the frequency dividing ratio into the programmable read only memory.

(18) The invention provides a method of producing a PLL oscillator, comprising the step of placing, into a package in a sealed fashion, components including a piezoelectric resonator, an oscillating circuit for generating an oscillating signal in cooperation with the piezoelectric resonator, a PLL circuit which operates using the oscillating signal provided from the oscillating circuit as a reference signal, a programmable read only memory for storing the frequency dividing ratio of a programmable frequency divider in the PLL circuit, and means for writing the frequency dividing ratio into the programmable read only memory, wherein the sealing of the package is performed in such a manner that the components are molded with a resin by injecting the resin into a mold from a side different from the side through which the writing terminal for writing the frequency dividing ratio extends outside the package.

(19) The invention provides a method of producing a PLL oscillator, comprising the steps of: placing, into a package, components including a piezoelectric resonator, an oscillating circuit for generating an oscillating signal in cooperation with the piezoelectric resonator, and a PLL circuit which operates using the oscillating signal provided from the oscillating circuit;

after placing the components into the package, adjusting the resonance frequency of the piezoelectric resonator; and sealing the package.

(20) The invention provides a PLL oscillator comprising a piezoelectric resonator, an oscillating circuit, a PLL circuit which operates using an oscillating signal provided from the oscillating circuit as a reference signal, and an output circuit for outputting the signal generated by the PLL circuit, all these elements being placed in a sealed package, the output frequency of the PLL oscillator being determined by the resonance frequency of the piezoelectric resonator and also by the frequency dividing ratio of a programmable frequency divider in the PLL circuit, the PLL oscillator further comprising means for selecting the frequency dividing ratio of the programmable frequency divider so that the output frequency is set to a desired value, the PLL oscillator further comprising means for stopping the operation of the oscillating circuit and/or switching the output circuit into a high-impedance state.

(21) The invention provides a PLL oscillator based on the aspect (20), wherein the oscillating circuit, the PLL circuit, and the output circuit are included in an IC, and a control pad for stopping the operation of the oscillating circuit and a control pad for switching the output circuit into a high-impedance state are disposed on the IC, at least one of the two control pads being connected via a bonded-wire to one lead terminal having a portion extending outside the package.

(22) The invention provides a PLL oscillator based on the aspect (20), further comprising means for selecting the frequency dividing ratio of the programmable frequency divider and also selecting the resonance frequency of the piezoelectric resonator so that the output frequency is set to an arbitrary desired value.

(23) The invention provides a PLL oscillator comprising a tuning fork type piezoelectric resonator, an oscillating circuit, a PLL circuit which operates using an oscillating signal provided from the oscillating circuit as a reference signal, and an output circuit for outputting the signal generated by the PLL circuit, all these elements being placed in a sealed package, the PLL oscillator having the standby capability for stopping the operation of the oscillating circuit and the operation of the output circuit wherein when the standby capability is enabled, only the oscillating circuit is operated.

(24) The invention provides a PLL oscillator based on the aspect (23), wherein the output frequency is determined by the resonance frequency of the tuning fork type piezoelectric resonator and the frequency dividing ratio of a programmable frequency divider in the PLL circuit, and the PLL oscillator further comprises means for selecting the frequency dividing ratio of the programmable frequency divider so that the output frequency is set to a desired value.

(25) a PLL oscillator based on the aspect (23), wherein the output frequency is determined by the resonance frequency of the tuning fork type piezoelectric resonator and the frequency dividing ratio of a programmable frequency divider in the PLL circuit, and the PLL oscillator further comprises means for selecting the frequency dividing ratio of the programmable frequency divider and also selecting the resonance frequency of the tuning fork type piezoelectric resonator so that the output frequency is set to a desired value.

(26) The invention provides a PLL oscillator comprising a piezoelectric resonator, an oscillating circuit for generating an oscillating signal in cooperation with the piezoelectric resonator, and a PLL circuit which operates using the oscillating signal provided from the oscillating circuit as a reference signal, the PLL circuit including a low-pass filter having an element disposed outside the IC of the PLL circuit, the element being placed in a sealed package together with the piezoelectric resonator, the oscillating circuit, and the PLL circuit.

(27) The invention provides a PLL oscillator based on the aspect (26), wherein the output frequency of the PLL oscillator is determined by the resonance frequency of the piezoelectric programmable frequency divider in the PLL circuit, and the PLL oscillator further comprises means for selecting the frequency dividing ratio of the programmable frequency divider so that the output frequency is set to a desired value.

(28) The invention provides a PLL oscillator based on the aspect (26), wherein the output frequency of the PLL oscillator is determined by the resonance frequency of the piezoelectric resonator and also by the frequency dividing ratio of a programmable frequency divider in the PLL circuit, and the PLL oscillator further comprises means for selecting the frequency dividing ratio of the programmable frequency divider and also selecting the resonance frequency of the piezoelectric resonator so that the output frequency is set to an arbitrary desired value.

(29) a PLL oscillator based on the aspect (26), wherein the package is a ceramic package, and a resistor of the low-pass filter is formed on the substrate of the ceramic package.

(30) The invention provides a PLL oscillator based on the aspect (26), wherein the package is a ceramic package, and a capacitor of the low-pass filter is formed on the substrate of the ceramic package.

(31) The invention provides a PLL oscillator based on the aspect (30), wherein one electrode of the capacitor is formed using a stage on which the IC including the PLL circuit is mounted.

(32) The invention provides a PLL oscillator comprising a piezoelectric resonator, an oscillating circuit for generating an oscillating signal in cooperation with the piezoelectric resonator, a PLL oscillating circuit which operates using the oscillating signal provided from the oscillating circuit as a reference signal, all these elements being placed in a sealed package, the oscillating circuit including means with a variable capacitor for adjusting the oscillation frequency of the oscillating circuit.

(33) The invention provides a PLL oscillator based on the aspect (32), wherein the output frequency of the PLL oscillator is determined by the resonance frequency of the piezoelectric resonator and also by the frequency dividing ratio of a programmable frequency divider in the PLL circuit, and the PLL oscillator further comprises means for selecting the frequency dividing ratio of the programmable frequency divider so that the output frequency is set to a desired value.

(34) The invention provides a PLL oscillator based on the aspect (32), wherein the output frequency of the PLL oscillator is determined by the resonance frequency of the piezoelectric resonator and also by the frequency dividing ratio of a programmable frequency divider in the PLL circuit, and the PLL oscillator further comprising means for selecting the frequency dividing ratio of the programmable frequency divider and also selecting the resonance frequency of the piezoelectric resonator so that the output frequency is set to an arbitrary desired value.

(35) The invention provides a PLL oscillator based on the aspect (32), wherein the variable capacitor is a capacitor array.

(36) The invention provides a PLL oscillator based on the aspect (35), further comprising a programmable read only memory for storing control data for controlling the capacitor array, and means for writing the data into the programmable read only memory after the package is sealed.

(37) The invention provides a PLL oscillator based on the aspect (32), wherein the capacitor is a variable-capacitance diode.

(38) The invention provides a PLL oscillator based on the aspect (32), wherein the capacitor is controlled by a control circuit having the capability of temperature detection.

(39) The invention provides a method of producing a PLL oscillator, comprising the steps of:

preparing a PLL oscillator including a piezoelectric resonator, an oscillating circuit for generating an oscillating signal in cooperation with the piezoelectric resonator, a PLL oscillating circuit which operates using the oscillating signal provided from the oscillating circuit as a reference signal, means for adjusting the oscillation frequency of the oscillating circuit by means of a capacitor array included in the oscillating circuit, and a fuse ROM for storing control data for controlling the capacitor array, all these elements being placed in a sealed package, the PLL oscillator further including means for writing the control data into the fuse ROM after the package is sealed, and a writing terminal via which the control data is written, the writing terminal having a portion extending outside the package; and cutting off the writing terminal after writing the control data.

The present invention has the following advantages.

In the technique based on any of aspects (1)–(10), (12)–(14), (16)–(19), the PLL circuit itself generates an output signal using the oscillation signal of the quartz resonator as the reference signal, and thus an inexpensive low-frequency quartz resonator can be employed, as opposed to the conventional techniques in which an expensive high-frequency quartz resonator is needed for each output frequency required. Furthermore, the PLL oscillator according to this technique can generates an output signal at a very high frequency which is so high that overtone oscillation is usually used, wherein the quartz resonator of the PLL oscillator can operate in a stable fashion at a fundamental frequency. Furthermore, the PLL oscillator can generates an output signal at even a further high frequency such as 80 MHz or higher, wherein the quartz resonator of the PLL oscillator can operate in a stable fashion at a fundamental frequency.

In the PLL oscillator according to the invention, since the quartz resonator is operated so that oscillation occurs at a fundamental frequency, the operation needs small power consumption compared to the overtone oscillator which is operated at a frequency in the overtone frequency range.

The PLL IC includes a frequency table covering all frequencies required in applications such as a computer. Therefore, various output frequencies can be achieved using only one type of PLL IC without having to modify the IC mask. The setting of the output frequency can be accomplished simply by modifying the data specifying the output frequency by means of wire bonding, fuse, or PROM. The production process is the same except for the setting of the output frequency. This brings about excellent productivity.

Before the data specifying the output frequency is written, all oscillators are the same. In other words, manufacturers need to have only one type of oscillator in stock to meet various requirements in terms of the output frequency, as opposed to the conventional techniques in which it is required to have various types of oscillators in stock.

Furthermore, since the quartz resonators which should be prepared in advance are limited to a limited number of types, it is possible to stock oscillators which are ready to write the data representing the output frequency. If a manufacturer gets an order from a customer, the manufacturer writes data in accordance with the frequency specified by the customer. This allows the delivery time to be reduced.

In the technique according to the aspect (11) of the invention, the terminal used to write the frequency dividing ratio is disposed on a side where none of other four terminals is disposed. This allows the terminals to be widely spaced so that no short circuit occurs between adjacent terminals. Furthermore, in operation under high-humidity condition, an error due to leakage current is prevented.

In the technique according to any of aspects (20)–(25) of the invention, both the OE and ST capabilities can be enabled at the same time thereby realizing a new capability of STZ.

When the PLL oscillator using a quartz resonator which needs a long starting time is switched into the ST or STZ mode, if the oscillation of the quartz resonator is maintained without being stopped, it is possible to reduce the time required to restart the operation of PLL oscillator.

In the technique according to any of aspects (26)–(28) of the invention, since an element of the LPF is realized using a chip component, it is possible to easily change the parameters of the LPF in accordance with the output frequency. That is, it is possible to set the parameters of the PLL circuit in accordance with the operation conditions.

Since the chip component is placed in a single package together with the PLL IC and the quartz resonator, users can easily use the PLL oscillator without having to mount additional external components.

In the technique according to any of aspects (29)–(31) of the invention, the elements of the LPF are formed in the ceramic package itself, and thus there is no need to form them on the PLL IC chip.

In the technique according to the aspect (19) of the invention, the quartz resonator to be used actually is coupled to the PLL IC, and the frequency adjustment is performed while monitoring the oscillation frequency. This makes it possible to produce a PLL oscillator capable of generating an output signal at a frequency exactly equal to a desired value regardless of the variation in load capacitance of the oscillating circuit stage of the PLL IC.

In the technique according to any of aspects (32)–(36) or (39) of the invention, the quartz resonator is operated in the fundamental frequency mode, and its frequency is adjusted to a desired value by adjusting the load capacitance of the oscillating circuit. The frequency adjustment can be performed easily. This technique makes it possible to produce a high-accuracy oscillator. Furthermore, by means of using the PLL circuit, it is possible to generate an output signal at a frequency which is so high that overtone oscillation is usually used (hereinafter such a high frequency will be referred to as a frequency in the overtone frequency range). That is, it is possible to produce a high-accuracy oscillator for use at a frequency in the overtone frequency range.

In the technique according to the aspect (37) of the invention, the load capacitance of the oscillating circuit is controlled by an external voltage thereby realizing a VCXO. If a PLL circuit is coupled with this technique so as to achieve a high output frequency in the overtone frequency range, it is possible to produce a VCXO capable of generating an output signal at a frequency in the overtone frequency range.

In the technique according to the aspect (38) of the invention, the load capacitance of the oscillating circuit is varied in accordance with temperature so that the output frequency is maintained at a fixed value regardless of the change in temperature.

BRIEF DESCRIPTION OF THE DRAWINGS

FIG. 2 is an output frequency table associated with a PLL oscillator, according to an embodiment of the invention.

FIG. 3 is an output frequency table associated with a PLL oscillator, according to another embodiment of the invention.

FIG. 4 is an output frequency table associated with a PLL oscillator, according to another embodiment of the invention.

FIG. 7 is an output frequency table associated with a PLL oscillator, according to an embodiment of the invention.

FIG. 12 is a functional table illustrating a PLL oscillator according to an embodiment of the invention.

DETAILED DESCRIPTION OF PREFERRED EMBODIMENTS

The present invention will be described in further detail below with reference to the accompanying drawings.
[Embodiment 1]

Figure 1:
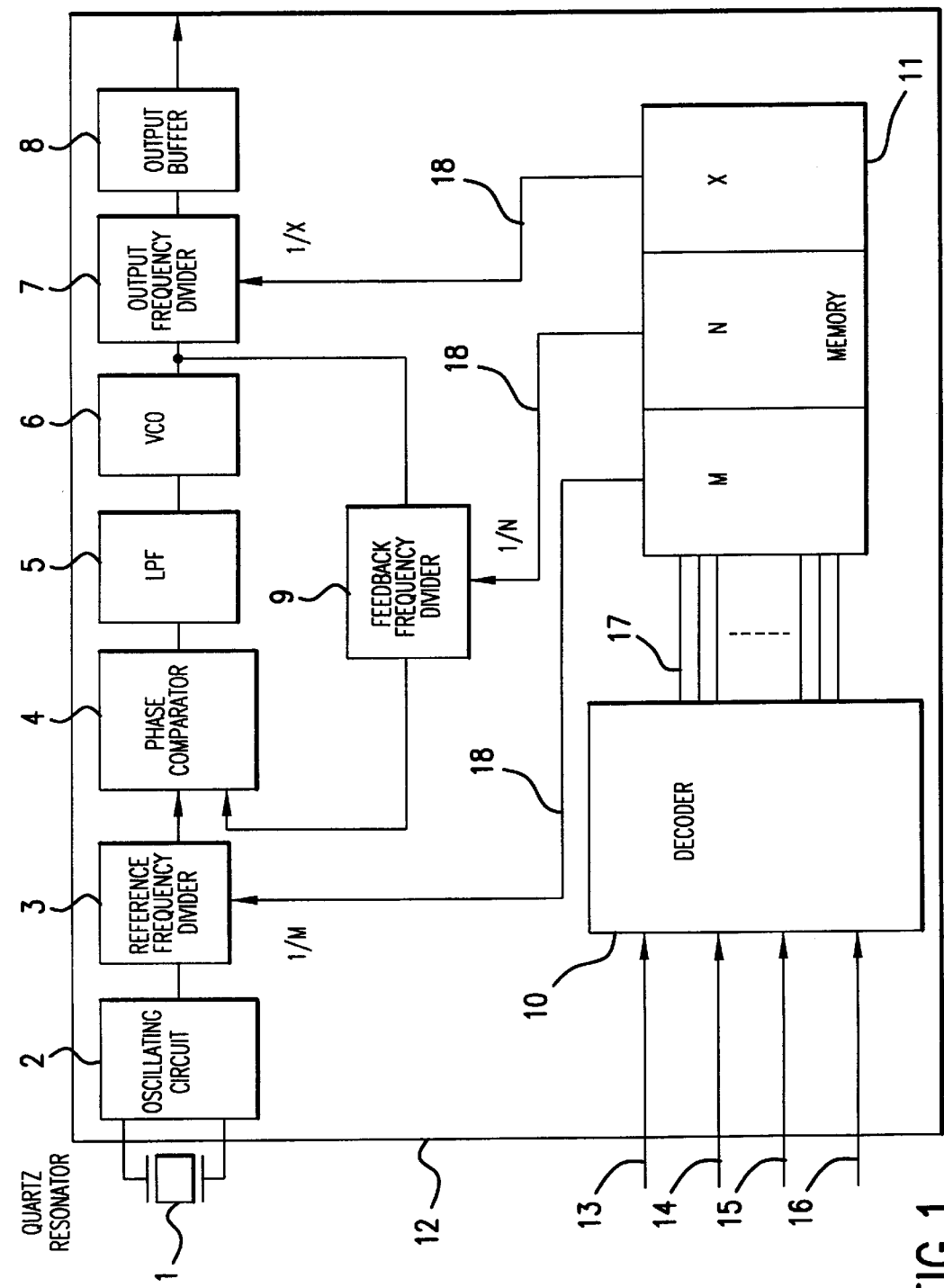
FIG. 1 is a block diagram illustrating a PLL circuit of a PLL oscillator according to an embodiment of the invention.

FIG. 1 is a block diagram of a PLL (phase locked loop) oscillator according to the aspect (1) of the invention described above.

A quartz resonator 1 is coupled to an oscillating circuit 2 so that oscillation occurs in cooperation between the quartz resonator 1 and the oscillating circuit 2. The signal generated by the oscillating circuit 2 is divided in frequency by a reference frequency divider 3. The resultant signal is input as a reference signal to a phase comparator 4. An oscillating signal is generated by a voltage controlled oscillator (hereinafter referred to as a "VCO") 6, and is divided in frequency by a feedback frequency divider 9. Then the divided signal is input to the phase comparator 4. The phase comparator 4 compares the phases of the above two input signals with each other, and outputs a voltage corresponding to the difference in phase between the two input signals. The output voltage is supplied via a low-pass filter (hereinafter referred to as an LPF) 5 to the VCO 6 thereby controlling the oscillation frequency of the VCO. The oscillation signal of the VCO 6 is further divided in frequency by an output frequency divider 7, and is output via an output buffer 8. In the above circuit, the reference frequency divider 3, the feedback frequency divider 9, and the output frequency divider are all constructed in the form of a programmable frequency divider capable of performing frequency division by a variable dividing ratio of an integer.

The output frequency is determined by the frequency dividing ratios of the programmable frequency dividers 3, 9, and 7, and is given by next equation.

$$fO = fC \times N/M \times 1/X$$

Here, M is the dividing ratio of the reference frequency divider 3, N is the dividing ratio of the feedback frequency divider 9, X is the dividing ratio of the output frequency divider 7, fC is the oscillation frequency of the quartz resonator, which is 32.768 kHz in this specific embodiment, and fO is the output frequency.

Possible values of the frequency dividing ratios are stored in a memory 11, and particular values of frequency dividing ratios 18 are read out from the memory 11 in accordance with an address signal 17 which is generated by a decoder 10 in accordance with signals input via frequency selection terminals including S0 terminal 13, S1 terminal 14, S3 terminal 15, and S3 terminal 16. The frequency dividing ratios 18 are transmitted to the respective programmable frequency dividers 3, 9, and 7.

FIG. 2 illustrates an example of a frequency table. This frequency table lists the values of frequency dividing ratios which are read out from the memory 11 in response to the signal applied to the frequency selection terminals, and corresponding output frequencies synthesized by the PLL. Actually obtainable frequencies are also shown in the frequency table. Although there are differences between the desired output frequencies and the corresponding actual frequencies, the differences are so small that no problem occurs in practical applications.

In the present embodiment, a 4-bit signal is applied to the frequency selection terminals including the S0 terminal 13, the S1 terminal 14, the S2 terminal 15, and S3 terminal 16, and therefore it is possible to select an output frequency from 16 different values. However, in the present invention, there is no limitation in terms of the number of bits for the frequency selection terminals.

The above frequency table covers those clock frequencies widely employed in personal computers. Frequencies of 20, 25, 33.3, 40, 50, 60, 66.6, 80, and 100 MHz are mainly used as clock frequencies for CPUs, 1.8432 MHz as a communication clock frequency, 14.318 MHz as a system reference clock frequency, 16 MHz as a bus clock frequency, 24 MHz as a clock frequency for floppy or hard disks, and 22.118, 32, and 48 MHz as a clock frequencies for other peripheral circuits.

For example, when a clock signal at a frequency of 66.6 MHz is required, the frequency selection terminals S0, S1, S2, and S3 are maintained at levels "L", "H", "H", and "H", respectively (level "L" refers to a GND level and level "H" refers to a VDD level).

In the present invention, the sets of output frequencies are not limited to those described above. The sets of output frequencies may also be selected arbitrarily by properly selecting the data of frequency dividing ratios M, N, and X stored in the memory 11.

FIG. 3 is an example of a frequency table for the case where an AT quartz resonator with a frequency of MHz order is employed as the quartz resonator for generating a reference frequency signal. In this example, the quartz resonator is assumed to have a resonance frequency of 20 MHz, and the sets of M, N, and X are selected so that the output frequencies include 40, 50, 60, 66.6 MHz, etc., which are suitable as a clock signal for a CPU in a computer system. In this case, there is no difference between the desired frequencies to be achieved and the actual frequencies.

Although in the present embodiment, a 32.768 KHz quartz resonator originally designed for use in a clock is employed as the piezoelectric resonator and a 20 MHz AT quartz is also employed, the frequencies of these elements may be different from those employed herein, and furthermore other types of piezoelectric resonators such as a ceramic resonator may also be employed. However, if the reference frequency is set to a value different from that employed in the present embodiment, it is required to determine the frequency dividing ratios of the respective frequency dividers according to the equation described above.

In the technique of the present embodiment as described above, the frequency dividing ratios M, N, and X of the respective programmable frequency dividers 3, 9, and 7 can be selected from the values stored in the memory 11 by applying a proper selection signal to the frequency selection terminals. Thus, it is possible to generate an output signal at various frequencies using a combination of one type of quartz resonator and one type of PLL IC. In particular, if sets of values of frequency dividing ratios are stored in the memory in the above-described manner, it is possible to cover the frequency range which is widely employed in computer applications.

[Embodiment 2]

FIG. 4 is a frequency table relating to a PLL oscillator according to the aspect (2) of the invention described above. In this second embodiment, the frequency dividing ratios M, N, and X of the respective programmable frequency dividers 3, 9 and 7 are modified from those employed in the first embodiment described above so that although the quartz oscillation frequency serving as the reference frequency for the PLL circuit is limited within a narrow range from 24 MHz to 27 MHz, it is possible to generate an output signal at any arbitrary frequency over the wide continuous range from 36 MHz to 140 MHz. That is, an output signal at an arbitrary frequency is generated by properly selecting both the quartz oscillation frequency and the frequency dividing ratios of the programmable PLL frequency dividers.

By way of example, an output signal at 66.6 MHz can be generated by applying a proper set of frequency selection signals to the frequency selection terminals and also by selecting a proper quartz resonator as follows. Referring to FIG. 4, it can be seen that the frequency of 66.6 MHz falls in a 66–72 MHz band. Therefore, to obtain the above frequency, the levels of the selection signals applied to the frequency selection terminals S0, S1, S2, and S3, are set to "L", "L", "L", and "H", respectively. In this case, the ratio of the output frequency to the quartz oscillation frequency or the frequency multiplication ratio becomes 2.75. Dividing 66.6 MHz by 2.75 yields 24.24 MHz, which is the frequency required to be generated by the quartz resonator. Thus, the output frequency of 66.6 MHz can be obtained by performing the setting in the manner described above.

The output frequency of 66.6 MHz can also be obtained, if a quartz resonator with a resonance frequency of 33.3 MHz is employed and the frequency multiplication ratio is set to 2. However, in practical applications, it is more desirable to employ a more inexpensive quartz resonator having a low CI value. For example, a high-frequency AT quartz resonator formed not into a convex shape but into a flat shape can be produced at a lower cost than a convex-shaped low-frequency AT quartz resonator. However, if the frequency is too high, it is required to lap the quartz resonator chip to a small thickness, and thus it is required to reduce the size of a wafer used. This determines the upper limits of the frequency. Furthermore, AT quartz resonators used at a fundamental frequency are low in CI (crystal impedance) than those used at an overtone frequency.

Besides, the oscillation at the fundamental frequency is more desirable since it does not need a 3rd-order frequency tuning circuit. When the AT quartz resonator is used in the fundamental frequency mode, it is desirable to select a frequency band which results in a good yield. This allows a low-cost quartz resonator to be employed to achieve a stable oscillating operation. In the present embodiment, the frequency range of 24 MHz to 27 MHz is employed from the above viewpoint, the frequency range may be varied depending on the size of the quartz resonator chip and the production system available in a factory. What is important is to employ a quartz resonator having a low CI value but being as inexpensive as possible.

The resonance frequency of a quartz resonator also depends on production processes such as cutting of a raw quartz material, lapping, etching, evaporation, and fine frequency adjustment. For example, a frequency variation of +16000 ppm can occur in the etching process, −9000 ppm in the evaporation process, and −7000 ppm in the fine frequency adjustment process. Thus, the overall variation in frequency falls within the range of −16000 ppm to +16000 ppm. In other words, the frequency of the quartz resonator can be adjusted within the range of 32000 ppm by the etching and following processes. In the case of the 24–27 MHz band, the variation of 32000 ppm approximately equals 800 KHz. Therefore, if the 24–27 MHz band is divided into four subbands, the full range of 24 to 27 MHz can be covered. This means that if four types of quartz resonator chips which have been cut and lapped are prepared, it is possible to produce a quartz resonator having an arbitrary desired resonance frequency in the range from 24 MHz to 27 MHz by properly adjusting the frequency in the etching and following processes. Since these four types of quartz resonator chips are very popular, the manufacturer can lap quartz resonator chips and stock them without having a risk of producing useless quartz resonator chips. This allows a PLL oscillator to be produced in a shorter time than required with the conventional technique. In this specific example, the variation of −16000 ppm to +16000 ppm is assumed to occur in the etching and following processes, and four types of quartz resonator chips are employed. However, it is possible to reduce the number of types of quartz resonator chips by increasing the amount of frequency variation.

Although in the specific example described above, 16 sets of frequency dividing ratios are employed and four types of quartz resonator chips are prepared, the number of sets of frequency dividing ratios in the frequency table may be increased so that the frequency bandwidth is reduced from the above bandwidth of 24–27 MHz. This allows only one type of quartz resonator to be employed in the reduced-width frequency band. Thus, it is required to stock only one type of quartz resonator.

Furthermore, if a greater number of sets of frequency dividing ratios are available in the frequency table, the required amount of frequency adjustment of the one type quartz resonator chip can be reduced. For example, when the frequency of quartz resonators is limited within the 5000 ppm range, it is possible to adjust the frequency to a desired value only by the fine frequency adjustment process which has the capability of changing the frequency within 7000 ppm. Therefore, it is possible to advance the process of the quartz resonator chip to the evaporation. Thus, quartz resonator chips may be stocked after performing more advanced process steps. This allows a further reduction in lead time in production.

In this embodiment, as described above, the output frequency can be set to an arbitrary desired value by selecting a quartz resonator having a proper resonance frequency and by selecting a proper set of frequency dividing ratios of the programmable frequency dividers of the PLL circuit from the values stored in the frequency table.

In the above description, the term the "frequency of quartz resonator" refers to the resonance frequency of the quartz resonator. As is well known to those skilled in the art, the oscillation of the quartz oscillator occurs at a frequency approximately equal to the resonance frequency of the quartz resonator.

[Embodiment 3]

Figure 5:
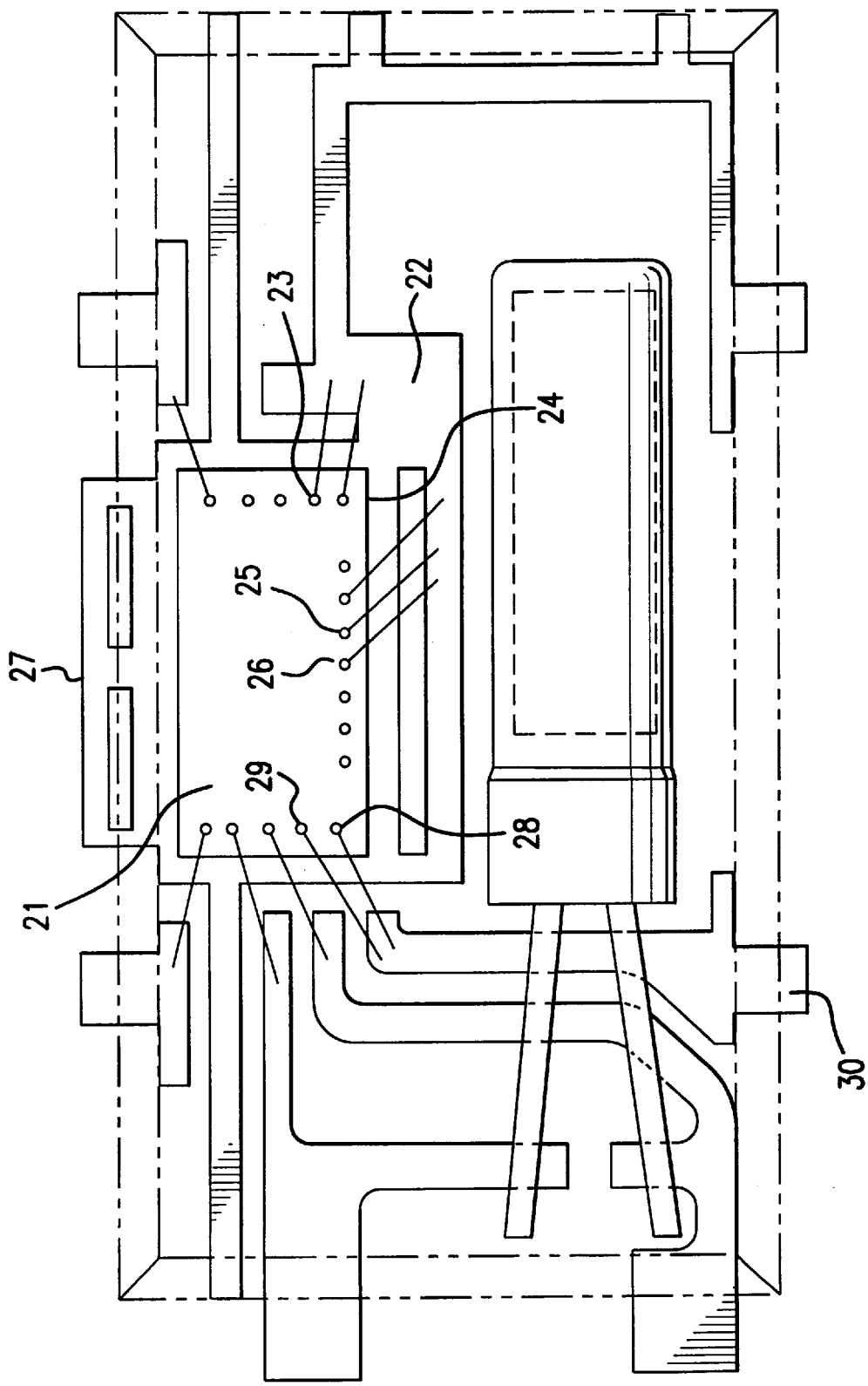
FIG. 5 is a schematic diagram illustrating the structure of a PLL oscillator according to an embodiment of the invention.

FIG. 5 is schematic diagram illustrating a technique of setting the output frequency of a PLL oscillator using a frequency table according to the aspect (3) or (4) of the invention.

A PLL IC chip 21 including the functional blocks shown in FIG. 1 is mounted on an island 22. Each pad of the PLL IC chip 21 is connected via a bonded-wire to a corresponding one of a plurality of lead terminals disposed around the island 22. A part of the island extends outside a package so that the outer portion serves as a heat radiating fin 27.

In this embodiment, pads 23, 24, 25, and 26 formed on the PLL IC chip 21 serve as the terminals via which the frequency dividing ratios of the programmable PLL frequency dividers are selected. Since these pads are pulled up, those pads to be maintained at an "H" level may remain left without being connected to any lead terminals or may be wire-bonded to a leadframe connected to VDD. Pads to be maintained at an "L" level are wire-bonded to a leadframe connected to GND. If the pads 23, 24, 25, and 26 are maintained at either "H" or "L" level in the above-described manner, a corresponding address signal is generated by the decoder and a set of frequency dividing ratios is read out from the memory in accordance with the address, and thus the output frequency is determined. Although in this specific embodiment the pads are pulled up, the pads may also be pulled down. Also in this case, the frequency may be selected in a similar manner by means of wire-bonding.

In the present embodiment, since the output frequency is internally set by means of the wire-bonding, users do not need any additional process to set the output frequency. In the above specific example, the output frequency is set by properly performing wire-bonding. Alternatively, the output frequency may also be set by properly cutting the connection patterns of the pads 23, 24, 25, and 26 in the package so that desired signal levels of "H" or "L" are applied to the respective pads 23, 24, 25, and 26.

[Embodiment 4]

Figure 6A:
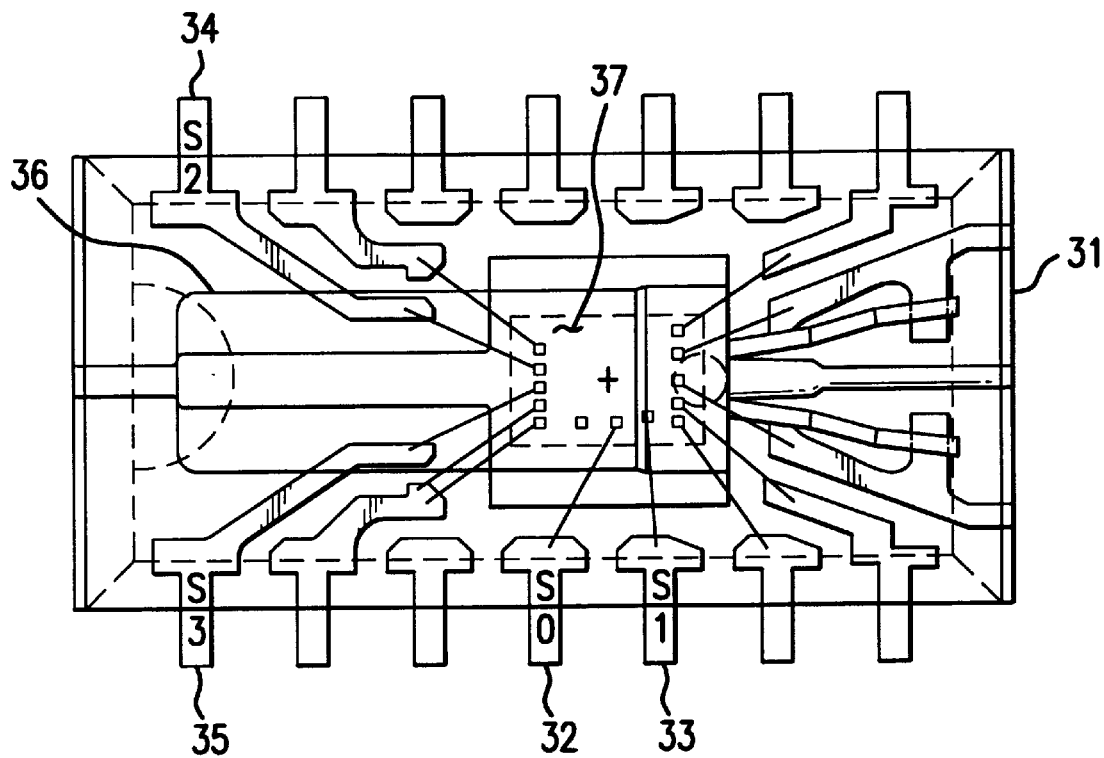
FIG. 6a is a schematic diagram illustrating the structure of a PLL oscillator according to an embodiment of the invention.
Figure 6B:
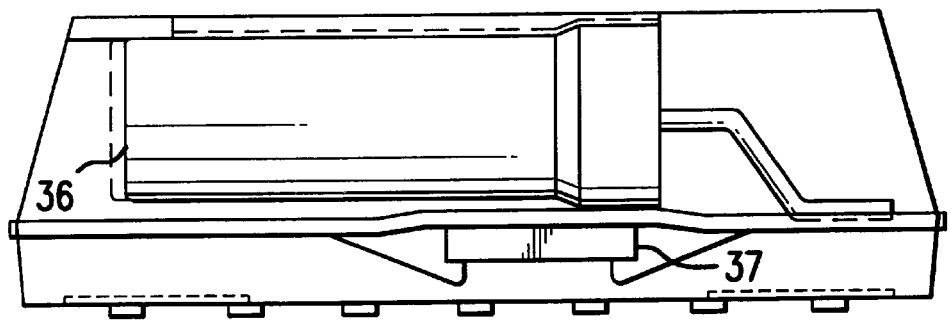
FIG. 6b is also a schematic diagram illustrating the structure of the PLL oscillator according to an embodiment of the invention.

FIGS. 6a and 6b illustrate a technique of setting the output frequency of a PLL oscillator using a frequency table mainly according to the aspect (5) or (6) of the invention.

A PLL IC chip 37 including the functional blocks shown in FIG. 1 and a quartz resonator 36 are housed in a single sealed package 31. Pads are formed on the PLL IC chip so that they serve as the terminals via which the frequency dividing ratios of the programmable PLL frequency dividers are selected. These pads are connected to output frequency selection terminals including S0 terminal 32, S1 terminal 33, S2 terminal 34, and S3 terminal 35 each having portions extending outside the package 31. By way of example, the PLL oscillator constructed in the above-described manner is assumed to include the frequency table shown in FIG. 2. When the PLL oscillator is operated to generate a 50 MHz signal used as a clock signal to a CPU, the frequency selection terminals S0, S1, S2, and S3 are set to "L", "H", "H", and "L", respectively. On the other hand, when it is desired to output a 66.6 MHz signal, the frequency selection terminals S0, S1, S2, and S3 are set to "L", "H", "H", and "H", respectively. In any case, the pattern of the circuit board on which the PLL oscillator is mounted is selected so that the electric connections given via the pattern result in the above signal levels at the respective frequency selection terminals. When the PLL oscillator is used to supply a signal to an unit other than the CPU, the pattern of the circuit board is formed so that the electric connections given via the pattern result in signal levels corresponding to the output frequency required by the unit. As described above, if the pattern on the circuit board is formed so that the terminals S0, S1, S2, and S3 are set to proper signal levels, it is possible to achieve various output frequencies required by various units in a personal computer, using only one type of PLL oscillator.

In the conventional techniques, a great number of oscillators of different types are required in a personal computer. In contrast, the present embodiment of the invention makes it possible to use PLL oscillators of the same type to generate all frequencies required. This allows the same type of component to be used in various applications.

When a user replaces a CPU operated at for example 50 MHz in his/her computer by an upgraded CPU operated at for example 66.6 MHz, it is also required to change the clock frequency. If the PLL oscillator according to the present embodiment is employed, the above change in the clock frequency can be achieved simply by changing the signal level at the terminal S3 from "L" to "H". In practice, the terminal S3 may be connected to either "L" or "H" level via a jumper switch or the like so that the above change in level may be accomplished in an easier fashion.

Although the frequency is selected by properly making electric connections via a circuit board pattern or via a jumper switch in the above specific example, the frequency may also be selected by generating frequency selection signals using a CPU or a control IC and sending the resultant frequency selection signals to the frequency selection terminals.

Another example of application of the present embodiment is descried below. FIG. 7 is a frequency table including frequency dividing ratios having values modified from those shown in FIG. 2. In this frequency table, the values are selected in such a manner as to cover the frequency range including 50, 60, 66.66 MHz used in common CPUs. If the signal level at the frequency selection terminal S0 is changed from "H" to "L", then the frequency is increased by 10% relative to that obtained when the terminal S0 remains at the level "H". For example, if the frequency selection terminals S0, S1, S2, and S3 are maintained at "H", "H", "H", and "H", respectively, the output frequency will be 50 MHz. If the signal levels at the frequency selection terminals are changes to "L", "H", "H", "H", then the output frequency becomes 55 MHz. On the other hand, 60 MHz obtained by the signal levels of "H", "L", "H", "H" can be changed to 66 MHz by employing signal levels of "L", "L", "H", "H". Another useful application of the present embodiment is to use the PLL oscillator in a computer production line to perform an operation margin test. That is, a clock signal which is about 10% greater than a normal clock frequency is generated by the PLL oscillator and is applied to a CPU to check whether the computer can operate correctly. For example, for the CPU designed to operate at 50 MHz, although all terminals S0, S1, S2, and S3 are held at "H" in a normal operation, the operation test is performed after changing the signal level at the terminal S0 to "L" so that a 55 MHz clock signal is generated. Before shipment after completion of the above operation test, the signal level at the terminal S0 is returned to "H" so that 50 MHz is obtained again. In a conventional technique, such a test is performed by supplying a clock signal with a 10 higher frequency from an external apparatus such as a board tester while temporarily disabling an oscillator mounted on a circuit board. In contrast, if the PLL oscillator according to the present embodiment is employed, the test can be accomplished simply by changing the signal level at the frequency selection terminal S0 from "H" to "L". The technique according to the present embodiment will become more important when the CPU operates at a higher frequency, because if a high-frequency clock signal is supplied from an external apparatus via a long cable or a contact probe, distortion can occur in the waveform of the clock signal, which can cause an error in the test. The PLL oscillator according to the present embodiment can be employed without encountering any problems even in such a high-frequency test, because the clock signal for the test is supplied from the same oscillator as that used in the normal operation and thus the clock signal for the test has substantially the same waveform as that in the normal operation. Therefore, the test can be accomplished in a simple fashion and the result is reliable.

[Embodiment 5]

Figure 8:
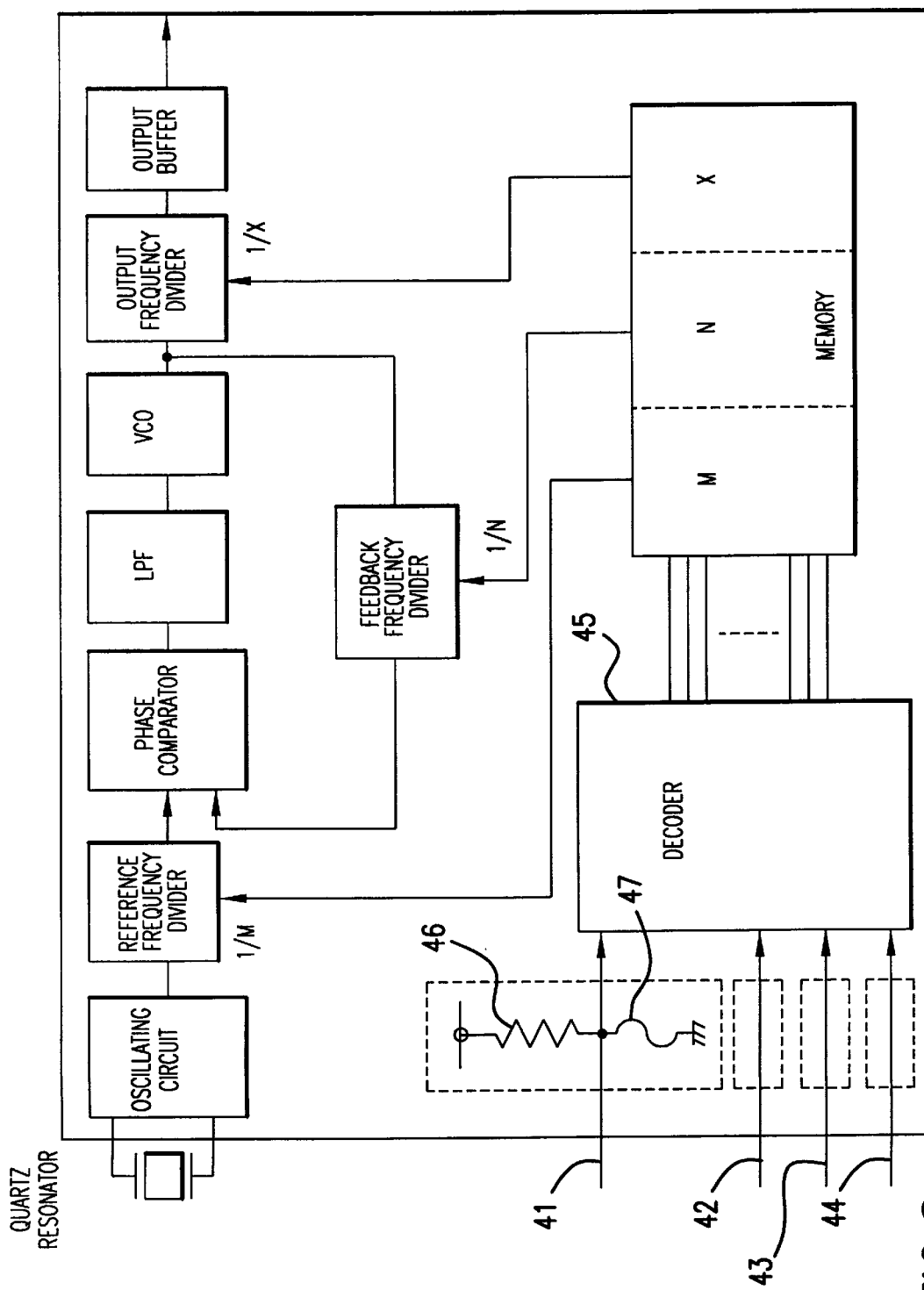
FIG. 8 is a functional block diagram illustrating a PLL oscillator according to an embodiment of the invention.

FIG. 8 is schematic diagram illustrating a technique of setting the output frequency of a PLL oscillator using a frequency table according to any of aspects (7), (8) or (14) of the invention.

The output frequency can be controlled from the outside by supplying proper selection signals to S0 terminal 41, S1 terminal 42, S2 terminal 43, and S3 terminal 44 connected to a decoder 45. Each frequency selection terminal is connected to VDD (power supply voltage) via a pull-up resistor 46. Furthermore, each frequency selection terminal is also connected to GND (ground potential) via a fuse 47.

Although the frequency selection terminals are connected to VDD via the pull-up resistors, the inputs of the decoder are maintained at an "L" level because the frequency selection terminals are short-circuited to GND via the fuses.

Any particular fuse can be blown out by applying a voltage between a corresponding external selection terminal and GND thereby passing a current through the fuse. Once the fuse has been blown out, the selection terminal is connected only to VDD via the pull-up resistor and is no longer connected to GND, and thus the corresponding input of the decoder is now at an "H" level. As described above, by properly blowing out fuses, the inputs of the decoder can be set to either "H" or "L" level as required.

Instead of applying a voltage, fuses may also be blown out by illuminating particular fuses by a laser beam. However, in the case of the technique of blowing out fuses by applying a voltage, the blowing out can be accomplished after mounting a PLL IC or a quartz resonator on a circuit board. This allows the process of blowing out fuses to be performed at the stage immediately before shipment to a user. Furthermore, since the blowing out can be performed simply by applying a voltage, the blowing out may be accomplished not only in production lines in factories, but even in sales stores.

Instead of forming fuses on an IC chip, fuses may also be formed in a leadframe. Since the outer portions of the respective frequency selection terminals located outside the package are no longer necessary after completion of blowing out fuses, they are cut off. This eliminates the risk of damaging the IC chip due to electrostatic noise via the selection terminals.

Although in the above specific example, fuses are used to form pull-down paths to maintain particular inputs of the decoder at "L" levels, fuses may also be employed to form pull-up paths.

In the present embodiment, as described above, the output frequency can be easily selected simply by blowing out particular fuses, and therefore the selection of the output frequency may be performed even after mounting an oscillator on a circuit board. This allows oscillators to be supplied to users in a short delivery time. In particular, when it is required that a small number of samples be presented to a user, the setting of the frequency may be performed even in a sales shop. Thus, samples may be presented to a user immediately whenever they are required without a delay.

[Embodiment 6]

Figure 9:
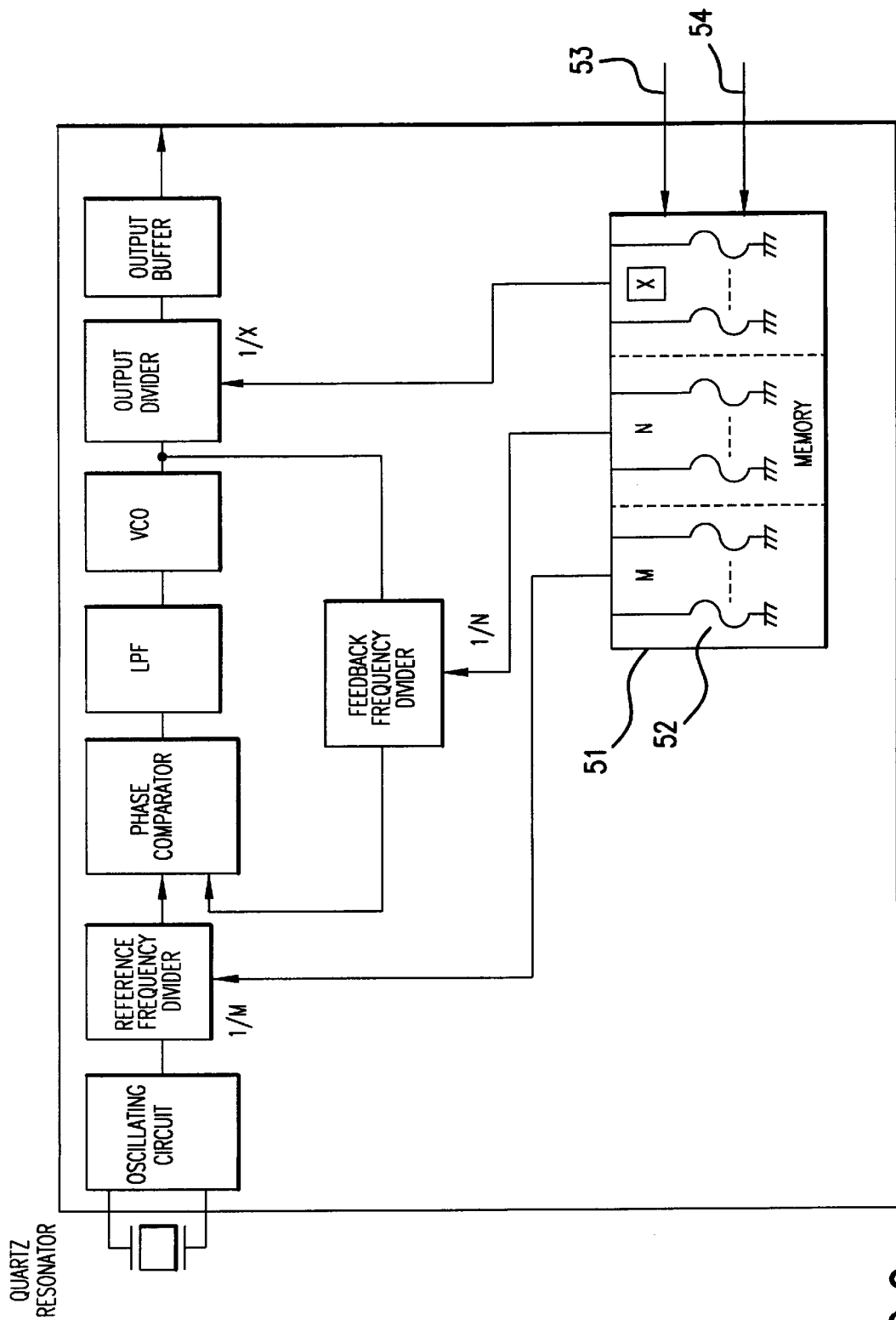
FIG. 9 is a functional block diagram illustrating a PLL oscillator according to an embodiment of the invention.

FIG. 9 illustrates a method of writing data representing the frequency dividing ratios of programmable frequency dividers so that the output frequency of a PLL oscillator is determined in accordance with the above data, based on the aspect (9) of the invention.

A memory is used to store the data representing the frequency dividing ratios associated with three programmable frequency dividers (reference frequency divider, feedback frequency divider, output frequency divider). In this specific embodiment, a programmable read only memory (hereinafter referred to as a PROM) 51 constructed with fuses 52 is employed as the above memory. The data representing the frequency dividing ratios output from the PROM 51 depends on the states of the fuses 52. The fuses 52 specified via the data input terminal 53 can be blown out by applying a voltage via the voltage input terminal 54.

Particular fuses 52 are blown out so that the frequency dividing ratios of the programmable frequency dividers are fixed to particular values thereby setting the output frequency to a desired value. Data representing which fuses should be blown out is input in a serial fashion via the data input terminal 53. After the data has been input, corresponding fuses 52 are blown out by applying a voltage to the voltage input terminal 54. The fuses remaining provide "L" level bits while the fuses blown out provide "H" level bits. In accordance with the binary data represented by these bits, the frequency dividing ratios of the programmable frequency dividers are determined.

Another technique of blowing out the fuses is to illuminate the desired fuses on the PLL IC chip by a laser beam.

Instead of the PROM of the fuse type, an electrically- or ultraviolet-erasable PROM may also be employed.

In the present embodiment, as described above, the data by which the output frequency is determined is written in the PROM before shipment, and thus users can use the PLL oscillator of the embodiment in a manner similar to a common quartz oscillator.

[Embodiment 7]

Figure 10A:
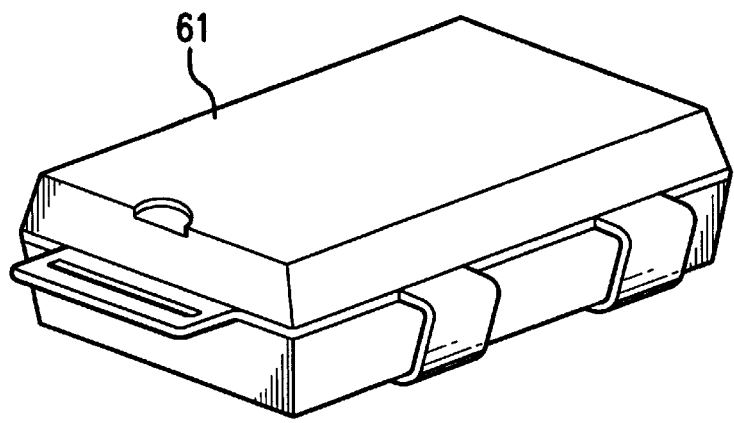
FIG. 10a is a schematic diagram illustrating the appearance of a PLL oscillator according to the invention.
Figure 10B:
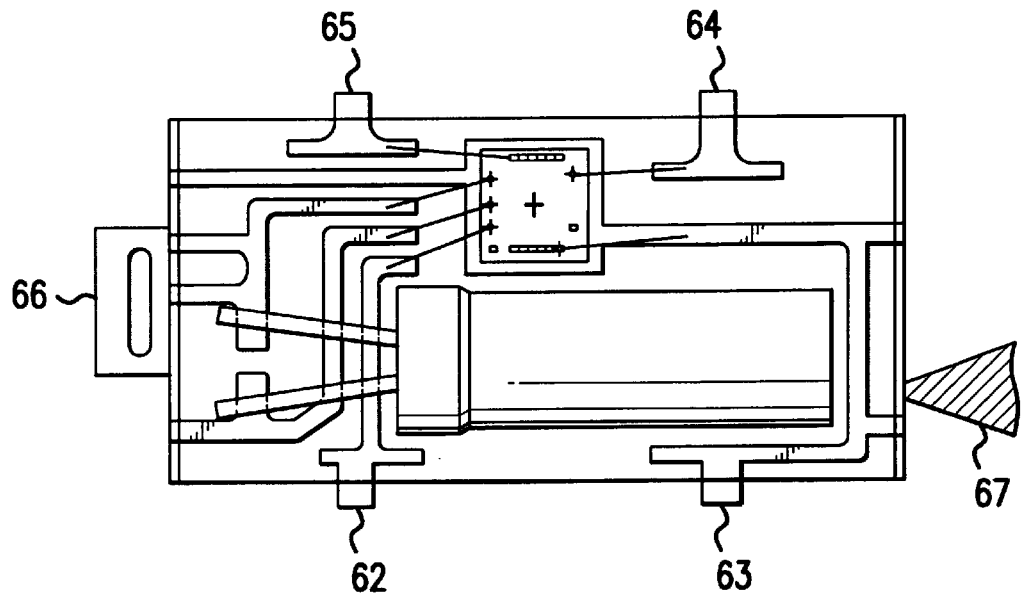
FIG. 10b is a schematic diagram illustrating the internal structure thereof.
Figure 10C:
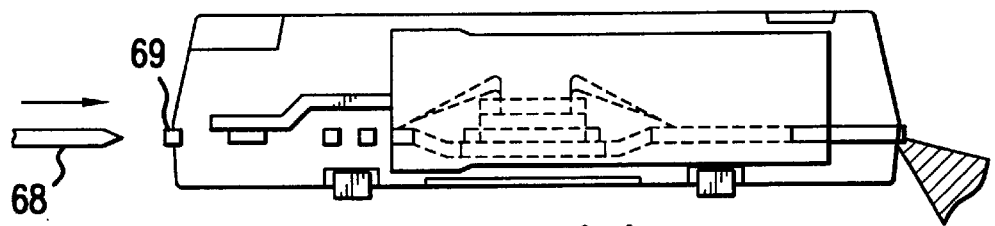
FIG. 10c is a side view of the PLL oscillator whose data write enable terminal is cut off.

FIGS. 10a, 10b, and 10c illustrate a technique of writing data representing the frequency dividing ratios of programmable frequency dividers so that the output frequency of a PLL oscillator can be determined in accordance with the above data, based on the aspect (10) or (11) or any of (15)–(18) of the invention. Furthermore, the present embodiment provides a technique of writing the data representing frequency dividing ratios after mounting a quartz resonator. Although the data can be written in various manners, the present embodiment describes only one of these techniques.

A PLL IC and a quartz resonator are housed in a resin molded package 61. There are provided an OE terminal 62 for controlling the output wire-bonded to the PLL IC disposed inside, a GND terminal 63 connected to ground, an OUT terminal 64 via which a clock signal is output, and a VDD terminal 65 connected to a power supply wherein they extend from the inside toward the outside of the package 61. These terminals are disposed at the most common pin locations.

On a side of the resin molded package on which none of the above lead terminals are located, there is provided a data write enable terminal 66 connected via a bonded-wire to the PLL IC. Since the data write enable terminal 66 is located on the resin molded package's side which has no other terminal such as the OE terminal 62, GND terminal 63, OUT terminal 64, VDD output 65, the terminals can be widely spaced thereby preventing the terminals from being short-circuited and also preventing erroneous operation due to leakage current under a high-humidity condition.

Furthermore, the data write enable terminal 66 is disposed so that the data write enable terminal 66 and a gate 67 are located on different sides of the resin molded package. If the data write enable terminal 66 and the gate 67 are located on the same side of the resin molded package, when a resin molding material is injected, the resin molding material flows over the data write enable terminal 66 and thus the data write enable terminal 66 is covered with a residual resin molding material. This causes an electric contact failure in data writing operation, and thus it becomes impossible to write data. In contrast, if the data write enable terminal 66 is disposed so that the data write enable terminal 66 and the gate 67 are located on different sides of the resin molded package, adhesion of the resin molding material to the data write enable terminal 66 does not occur, and therefore good electric contact can be achieved during the data writing operation.

If an "L"-level signal is applied to the data write enable terminal 66, the operation is switched into a data write mode. In the data write mode, the OUT terminal 64, which serves to output a clock signal in a normal operation mode, serves as a terminal for receiving data representing frequency dividing ratios, and the OE terminal 62 which serves, in the normal operation mode, as a terminal via which the output level can be switched into a high impedance, serves as a terminal via which a voltage is applied to fix the written data of the frequency dividing ratios.

The practical procedure of writing data of the frequency dividing ratios will be described below. First, an "L"-level signal is applied to the data write enable terminal 66 so that the data write mode is enabled. Data representing the frequency dividing ratios associated with the programmable frequency dividers required to output a clock signal at a desired frequency is input via the OUT terminal 64 which acts, in the data write mode, as a terminal for receiving the data of the frequency dividing ratios. Then a voltage is applied to the OE terminal 63 which serves, in the data write mode, as a terminal for receiving the voltage to fix the written data of the frequency dividing ratio, thereby fixing the data of the frequency dividing ratios of the programmable frequency dividers. After that, the data write enable terminal 66 is cut off. Although in this specific example the data of the frequency dividing ratios is written using the data write enable terminal 66, this is just an example and the writing can be performed in various ways.

In the embodiment described above, the data write enable terminal 66 is formed in such a manner that it has a portion extending outside the package for use in the data writing operation. Alternatively, as will be described below with reference to FIG. 10c, the data write enable terminal 66 may also be formed in such a manner that no part of the data write enable terminal 66 extends outside the package. FIG. 10c is a cross-sectional view of a resin molded package. Although a data write enable terminal is provided, it is cut off, by means of a pressing process, at a position near the surface of the resin molded package. Thus, a cut surface 69 of the data write enable terminal is exposed at the surface of the resin molded package. When data is written, a needle-shaped probe 68 is placed so that it comes in electric contact with the cut surface 69. With this arrangement, as with the above embodiment, it is possible to write data to set the output frequency to a desired value. The advantage of this technique is that since the data write enable terminal 66 is cut off by means of common pressing process before writing data, there is no need to cut off the data write enable terminal 66 after writing the data. Therefore, no machine is needed to cut off the data write enable terminal. Besides, it is possible to achieve a further reduction in the delivery time.

With the conventional technique, when a manufacturer gets an order of a quartz oscillator, the manufacturer starts a production including IC die attachment, wire bonding, mounting of a quartz resonator, resin mold packaging, plating of lead terminals, and pressing. Then a produced quartz oscillator is shipped. If a proper quartz resonator is not available, it is also required to produce the quartz resonator. In contrast, with the technique of producing a PLL oscillator according to the present invention, a PLL oscillator including a PLL IC and a quartz resonator housed in a resin molded package with lead terminals plated and pressed is prepared before receiving an order. When a manufacturer gets an order, the manufacture writes data and ships a PLL oscillator. That is, with the technique of the invention, it is possible to complete a PLL oscillator just by setting the output frequency of the PLL oscillator which has been already prepared, and thus it is possible to supply the PLL oscillator to a user in a short delivery time.

[Embodiment 8]

Figure 11:
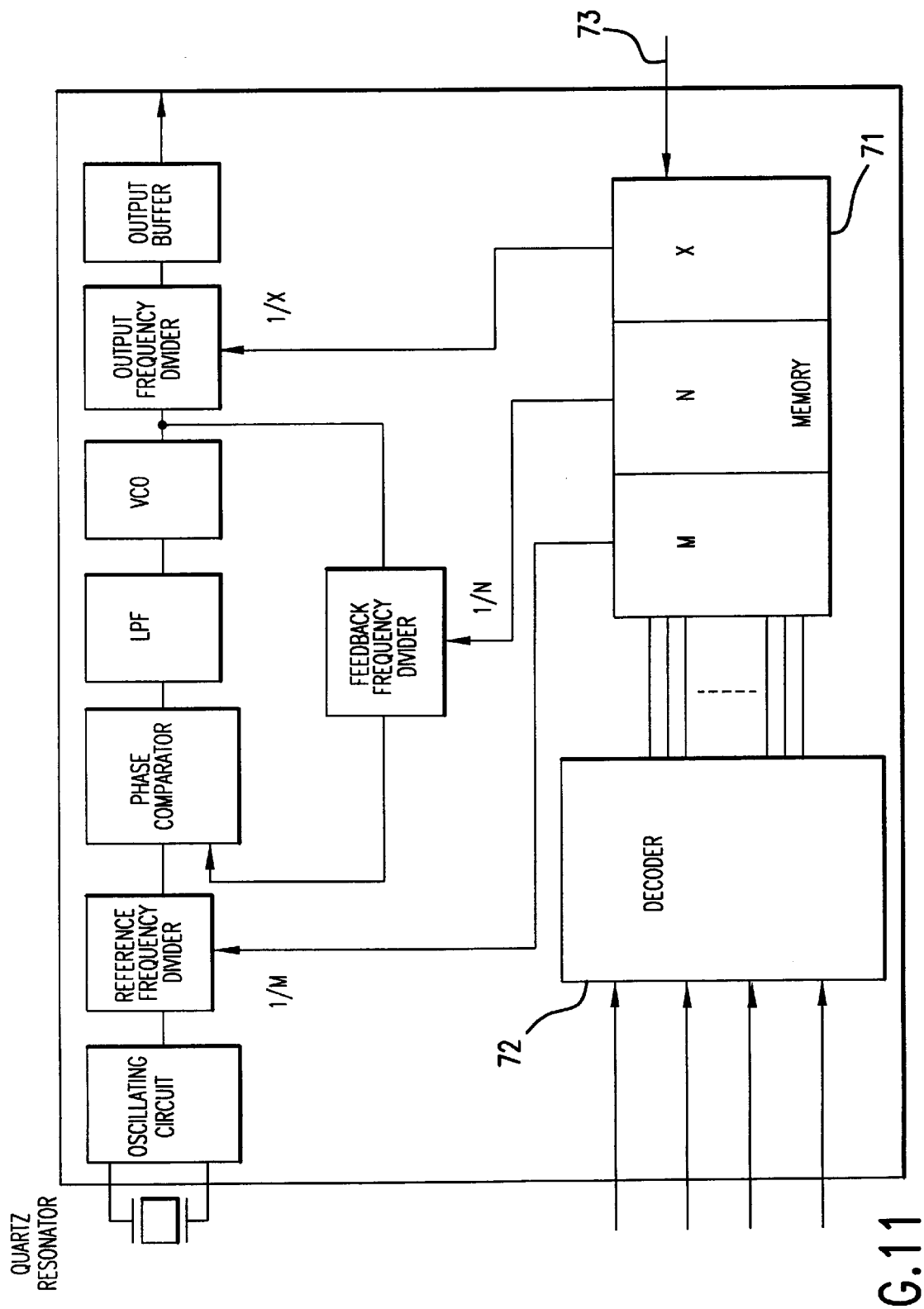
FIG. 11 is a functional block diagram illustrating a PLL oscillator according to an embodiment of the invention.

FIG. 11 illustrates a method of writing data representing the frequency dividing ratio of a programmable frequency divider so that the output frequency of a PLL oscillator can be determined in accordance with the above data, based on the aspect (9) or (10) of the invention. In this technique, it is possible to select an output frequency from two more values stored in a frequency table.

Data stored in a PROM 71 at an address specified via a decoder 72 is supplied to programmable frequency dividers.

The frequency dividing ratios of three programmable frequency dividers (reference frequency divider, feedback frequency divider, output frequency divider) are controlled in accordance with the data output from the PROM 71. In an initial state, the PROM 71 includes no data representing the frequency dividing ratios of the programmable frequency dividers. Therefore, it is required to write, into the PROM 71 via a data input terminal 73, the frequency dividing ratios of the programmable frequency dividers in accordance with the output frequency to be achieved. As for the PROM, an electrically erasable or ultraviolet-erasable PROM may be employed. Or a PROM may also be formed on the PLL IC chip using a metal mask. Except for the technique using the metal mask, the writing of the data can be accomplished during the production process of the PLL oscillator. In the technique in which data representing possible frequency dividing ratios of the programmable frequency dividers are stored in the memory in advance, and proper values are selected from the stored data so as to achieve a desired output frequency, there is a possibility that some output frequencies requested by users cannot be achieved. However, since the PROM is used as the memory in this embodiment, it is possible to store correct data representing frequency dividing ratios needed to achieve any output frequency requested by users.

In this embodiment, as described above, the data relating to the output frequency or the frequency multiplication ratio of the PLL oscillator can be set in a simple and easy fashion for any frequencies requested by users.

[Embodiment 9]

Referring to FIG. 5, a PLL oscillator based mainly on the aspect (20) or (21) will be described below.

A pad 28 serving as an output enable (hereinafter referred to as OE) terminal and a pad 29 serving as a standby (hereinafter referred to as ST) mode selection terminal are formed on a PLL IC 21 and wire-bonded to a lead terminal 30.

Since the OE pad 28 and the ST pad 29 are disposed on the PLL IC 21 at locations near each other, it is possible to connect either one of these two pads to the lead terminal 30 via a bonded wire or connect both pads to the same lead terminal 30. If both pads are connected to the same lead terminal 30, a new capability (STZ capability) is created. FIG. 12 is a functional diagram illustrating the OE, ST, and STZ capabilities. The OE capability refers to the capability of switching the state of the output terminal into a high-impedance state while maintaining the PLL circuit and the oscillating circuit coupled with the quartz resonator in operation. In an operation test of a computer or the like, when the clock signal output by the oscillator is stopped and an external clock signal is used for the operation test, the output terminal can be switched into the high-impedance state using the OE capability.

The standby capability refers to the capability of stopping the operation of both the PLL circuit and the oscillating circuit coupled with the quartz resonator so as to reduce the power consumption. When the PLL oscillator is in the standby mode, the output terminal is fixed to an "L" or "H" level. This standby capability is useful to achieve a reduction in power consumption of electronic equipment such as a computer.

The STZ capability refers to the capability of switching the output terminal into the high-impedance state and simultaneously stopping the operation of the PLL circuit and the oscillating circuit coupled with the quartz resonator so as to reduce the power consumption. This capability can be utilized not only in a normal operation to reduce the power consumption but also in an operation test of a computer or the like in a production line.

[Embodiment 10]

A PLL oscillator based on the aspect (23) of the invention is described below.

In the ST and STZ capabilities described above, if a tuning fork type resonator is used to generate a reference signal at a rather low frequency such as 32 kHz for use by the PLL circuit, a long time is required to start oscillation. Therefore, if the quartz oscillation is stopped in the standby mode, a long time of a few hundred msec to a few sec is needed to restart the oscillation after the standby mode is released. To avoid the above problem, the oscillating circuit coupled with the quartz resonator is maintained in operation even in the standby mode thereby ensuring that oscillation can be restarted in a short time after the ST or STZ capability is released. This technique makes it possible to restart the oscillation in as short a time as a few msec. When the oscillating circuit is operated at a low frequency such as 32 KHz, the oscillator needs an only a low current such as a few $\mu A$, and thus the intended advantages of the ST and STZ capabilities are still maintained.

[Embodiment 11]

Figure 13:
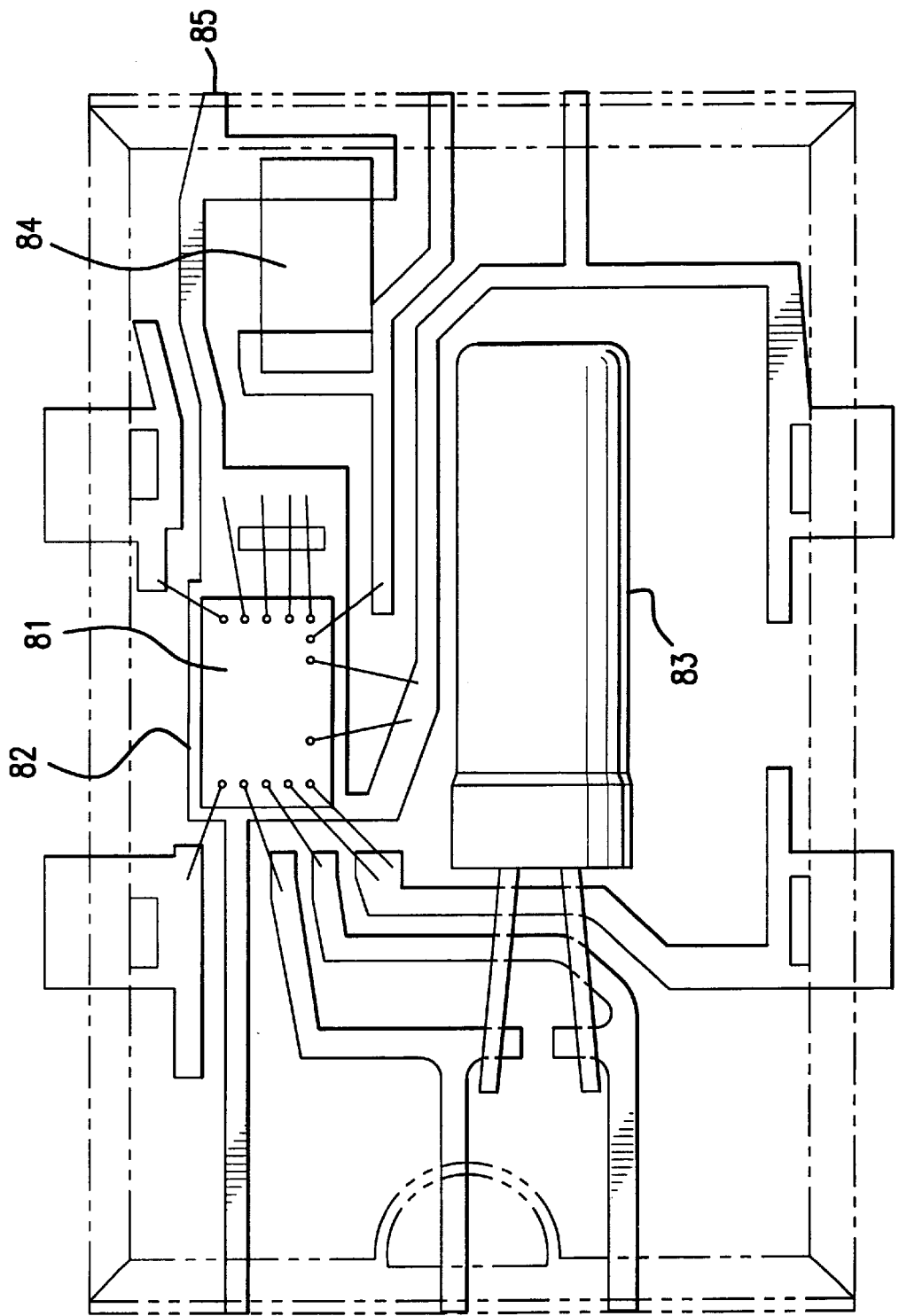
FIG. 13 is a schematic diagram illustrating the structure of a PLL oscillator according to an embodiment of the invention.

FIG. 13 illustrates an embodiment of the invention mainly based on the aspect (26) described above. In this embodiment, a capacitor disposed outside an IC is used to form an LPF in a PLL circuit. In the following description, by way of example, a chip capacitor is employed as the above capacitor, and the chip capacitor and other components such as a quartz resonator and a PLL IC are all housed in a single package.

A PLL IC chip 81 is mounted on an island 82. Each pad of the PLL IC chip 81 is wire-bonded to a corresponding one of a plurality of lead terminals disposed around the island 82. The quartz resonator 83 and the chip capacitor 84 are also connected to corresponding lead terminals 85, and all these components are molded with a resin molding material.

It is generally required that the capacitor used to form the LPF in the PLL circuit should have as large capacitance as at least a few hundreds pF or greater. If such a large capacitance is realized on an IC chip, the capacitor will occupy a large area of the IC chip, which will result in an increase in cost. In this embodiment, to avoid the above problem, a low-cost chip capacitor is employed to realize the LPF capacitance and it is molded in the single package together with the PLL IC and the quartz resonator thereby reducing the production cost.

In the PLL circuit, it is required to set the parameters of the LPF to optimum values depending on the frequency of the reference signal so as to suppress the fluctuation or jitter in the output frequency. The employment of the chip capacitor allows the parameters of the LPF to be modified easily.

In this embodiment, as described above, the capacitor used to form the LPF is realized by the chip capacitor. Similarly, other elements such as a resistor or an inductor required to form the LPF may also be realized by chip components.

In this embodiment, as described above, since an element needed to form an LPF is realized by a low-cost component whose parameter can be easily changed and which is disposed outside an IC, the IC can be produced at a reduced cost. Thus it is possible to produce a PLL oscillator whose LPF parameters can be easily set.

[Embodiment 12]

Figure 14A:
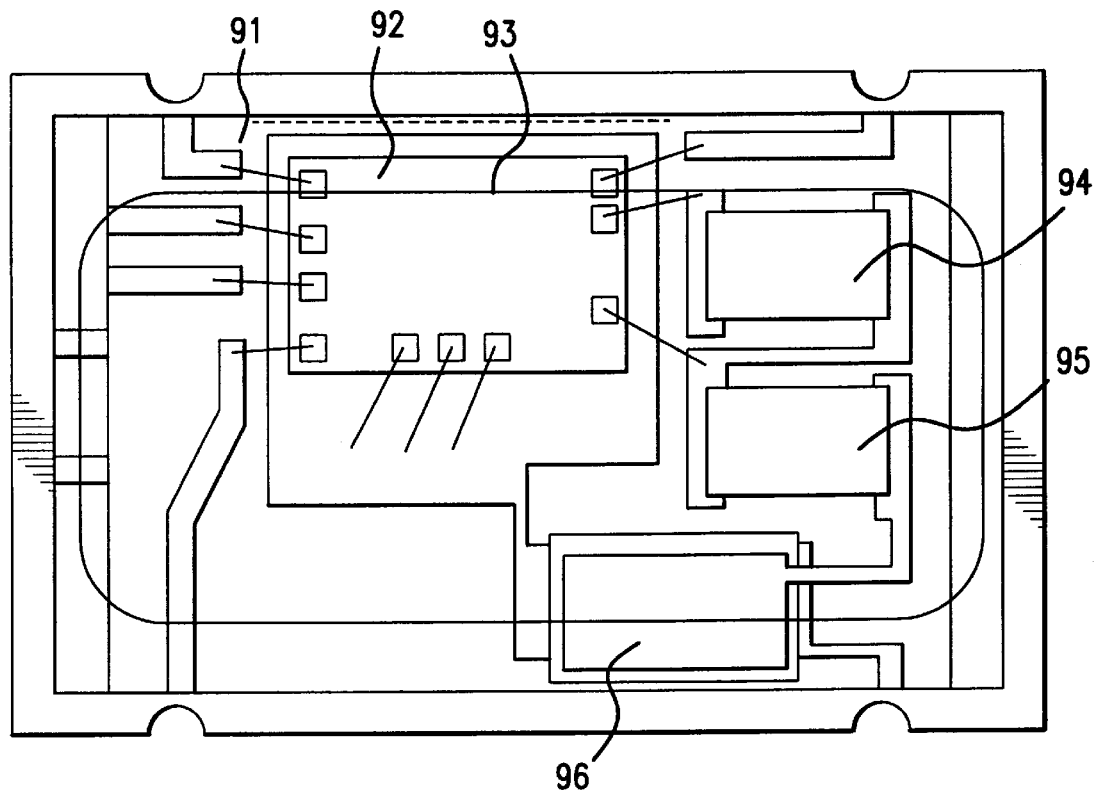
FIG. 14a is a schematic diagram illustrating the structure of a PLL oscillator according to an embodiment of the invention.
Figure 14B:
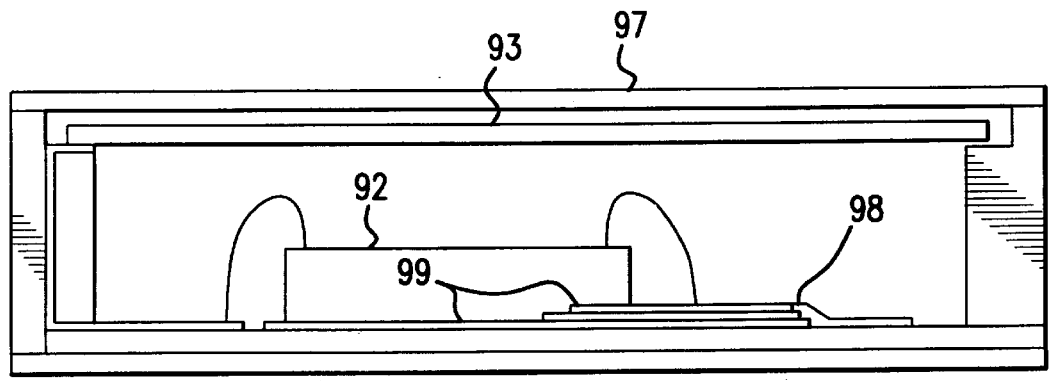
FIG. 14b is a side view thereof.

FIGS. 14*a* and 14*b* illustrate an embodiment of the invention mainly based on the aspect (29) described above. In this embodiment, a PLL oscillator is realized in a ceramic package. FIG. 14*a* is a top view of the package and FIG. 14*b* is a side view thereof.

A PLL IC 92 and a quartz resonator 93 are mounted on a ceramic substrate 91. Furthermore, resistors 94 and 95 and a capacitor 96 are disposed to form an LPF. The resistors 94 and 95 are made by means of printing. The capacitor 96 is formed, on the ceramic substrate 91, with a dielectric 98 placed between two electrodes 99.

Figure 15A:
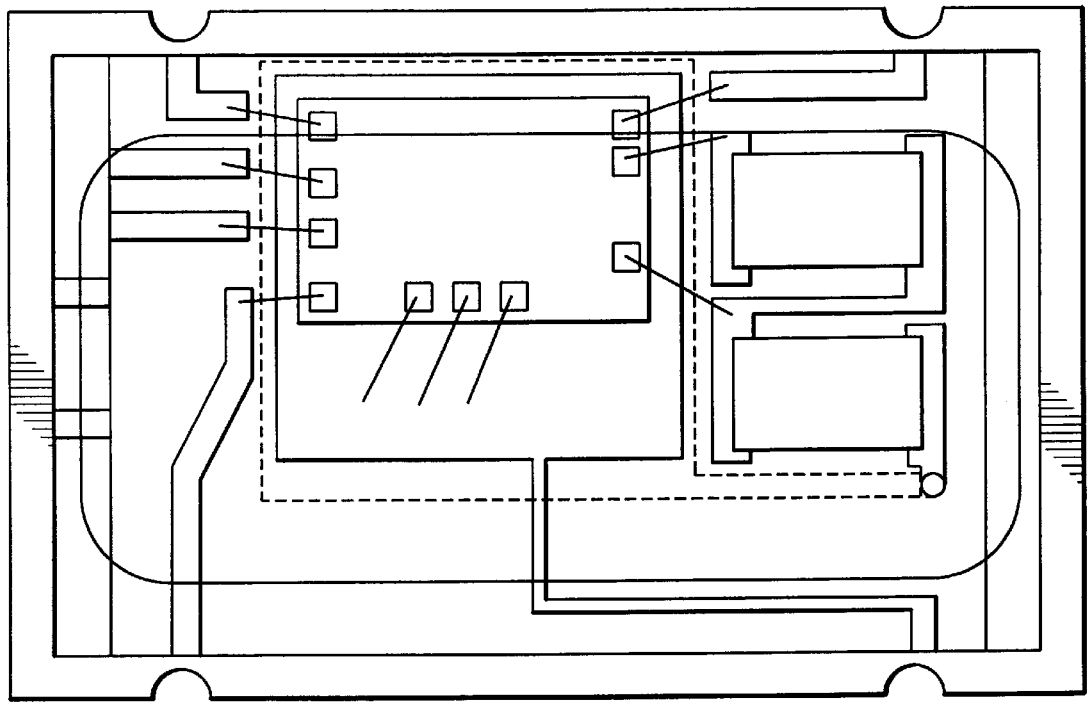
FIG. 15a is a schematic diagram illustrating the structure of a PLL oscillator according to an embodiment of the invention.
Figure 15B:
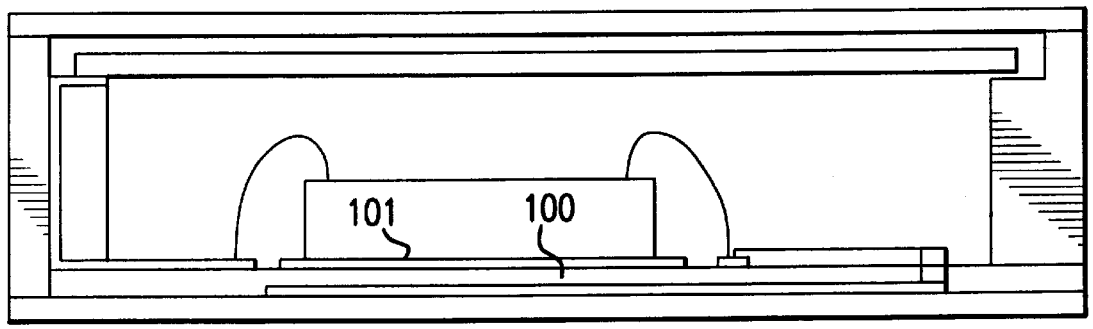
FIG. 15b is a side view thereof.

In the present embodiment, a lag-lead filter of the most common type is employed as the LPF in the PLL circuit. Instead, a lag filter or an active filter may also be employed. The capacitor may also be formed integrally within the ceramic substrate, as shown in FIGS. 15*a* and 15*b*, using the ceramic of the package itself as a dielectric 100 of the capacitor. Furthermore, the stage 101 of the IC may also be used so that the stage 101 also acts as one of two electrodes of the capacitor. This allows a reduction in the size of the package. If a multilayer ceramic substrate is employed, it is possible to realize a capacitor in the form of a multilayer structure using inner layers of the ceramic substrate. This allows a further reduction in the size.

In the PLL oscillator of the present embodiment, as described above, since the resistors and the capacitor of the LPF are formed using the ceramic substrate, a small-sized low-cost PLL IC can be employed. Thus, it is possible to realize a PLL oscillator housed in a small-sized package.

[Embodiment 13]

Referring to FIGS. 14*a* and 14*b*, a PLL oscillator based mainly to the aspect (19) of the invention will be described below.

First, a PLL IC 92 is mounted and electrical connections are made by means of wire boding. When the output frequency is determined, a quartz resonator chip 93 is mounted and then the package is sealed with a lid 97.

In this embodiment, since the PLL IC 92 is prepared in the form in which wires have been already bonded, if the quartz resonator chip 93 is mounted and electric power is supplied, the PLL IC 92 can be operated. Therefore, after mounting the quartz resonator 93, the PLL oscillator is operated and the frequency of the quartz resonator chip is adjusted while monitoring the output frequency. If the frequency has been set to a desired value, the package is sealed with the lid. In this technique, the adjustment of the frequency is performed for the quartz resonator chip which is combined with a PLL IC and is operated actually. If a deviation in frequency from a desired value is observed, the frequency is adjusted so that the deviation is eliminated. Thus, it is possible to obtain a high-accuracy PLL oscillator which operates at a frequency precisely equal to the desired value. The frequency of the quartz resonator may be adjusted for example by evaporating metal onto the electrode of the quartz resonator, or by cutting the electrode using a laser beam.

Although the PLL oscillator is realized using a ceramic package in the specific example described above, other types of packages such as a metal can or a plastic package may also be employed as long as a bare quartz resonator chip can be housed in the package without being molded.

If the technique of the present embodiment is implemented using a PLL IC and a quartz resonator according to the technique described earlier with reference to the second embodiment, it becomes possible to determine the output frequency of the oscillator at the stage of adjusting the frequency of the quartz resonator just before sealing the package. This allows a reduction in production time.

[Embodiment 14]

Figure 16:
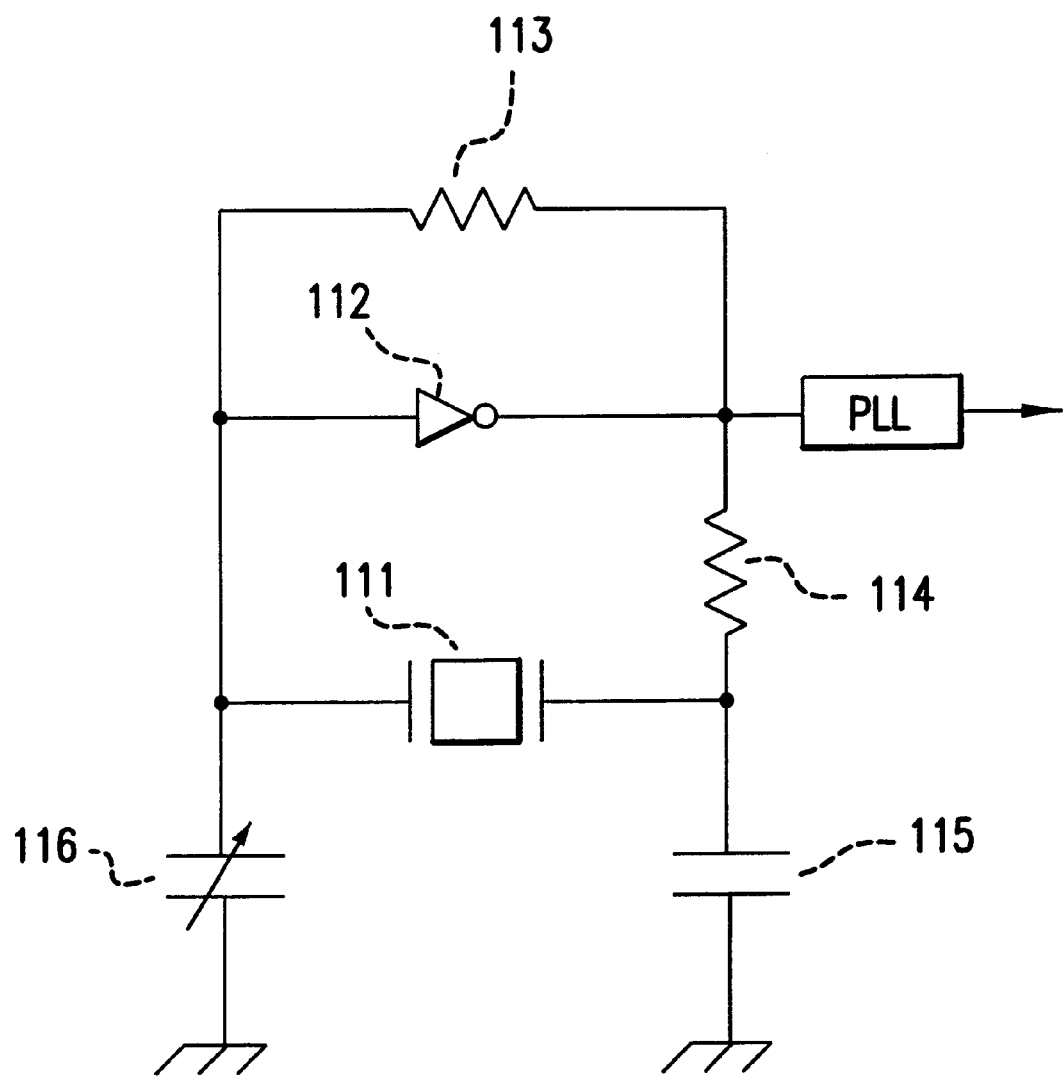
FIG. 16 is a circuit diagram of an oscillating circuit used to implement a PLL oscillator according to an embodiment of the invention.

FIG. 16 illustrates an embodiment of a high-accuracy PLL oscillator whose frequency can be adjusted, based mainly on the aspect (32) described above.

As for the quartz resonator 111 for generating a reference signal to a PLL circuit, an AT quartz resonator is used in a fundamental frequency mode. An oscillating circuit includes an inverter 112, a feedback resistor 113, a drain resistor 114, a gate capacitance 116, and a drain capacitance 115. The gate capacitance 116 is variable, and the frequency is adjusted by properly varying the gate capacitance 116.

By way of example, when it is desired that the PLL oscillator should operate at an output frequency of 50 MHz, if a 25 MHz quartz resonator is used and the frequency of the quartz resonator is multiplied by 2, then the output frequency of 50 MHz can be achieved. However, in practice, a frequency deviation from 50 MHz can occur owing to variations in parameters of the oscillating circuit of the IC or variation in the frequency of the quartz resonator. To cancel the above frequency deviation, the gate capacitance is varied. When the output frequency is higher than 50 MHz, the gate capacitance is increased so as to reduce the oscillation frequency until the output frequency becomes equal to 50 MHz. On the other hand, if the output frequency is lower than 50 MHz, the gate capacitance is reduced so as to increase the oscillation frequency until the output frequency becomes equal to 50 MHz. Thus, it is possible to achieve the output frequency precisely equal to the desired value. When the output frequency of the PLL oscillator with a frequency multiplication of 2 is adjusted to 50 MHz, actual adjustment is performed by adjusting the frequency of the reference signal of the PLL circuit to 25 MHz. The output frequency of 50 MHz is achieved by multiplying the adjusted reference frequency of 25 MHz by 2 via the PLL circuit.

In the case where the quartz resonator is operated in the fundamental frequency mode, a variation in the oscillation frequency obtained when the capacitance in the oscillating circuit is varied is greater than that obtained in the overtone oscillation mode. This means that the adjustment of frequency can be performed by varying the capacitance by a small amount. Therefore, if the same value of capacitance is employed, a greater amount of frequency deviation is allowed in the oscillation in the fundamental frequency mode. Theoretically, if the same value of capacitance is employed in the frequency adjustment, the fundamental frequency mode can cover a frequency range 9 times wider than can be covered by the overtone oscillation. In the overtone oscillating circuit, if the capacitance of the oscillating circuit is changed beyond a certain limit, the oscillation can jump into another order overtone mode owing to a change in the negative resistance versus frequency characteristic. Therefore, the frequency adjustment of the overtone oscillating circuit is very critical and risky. For example, when the oscillator is operated at 50 MHz in the 3rd order overtone mode, the oscillation frequency can jump into 16.6 MHz in the 1st order mode or into 83.3 MHz in the 5th order overtone mode.

The variable capacitance may also be realized by employing a trimmer capacitor, a variable-capacitance diode, a capacitor array formed on an IC chip, or the like.

[Embodiment 15]

Figure 17:
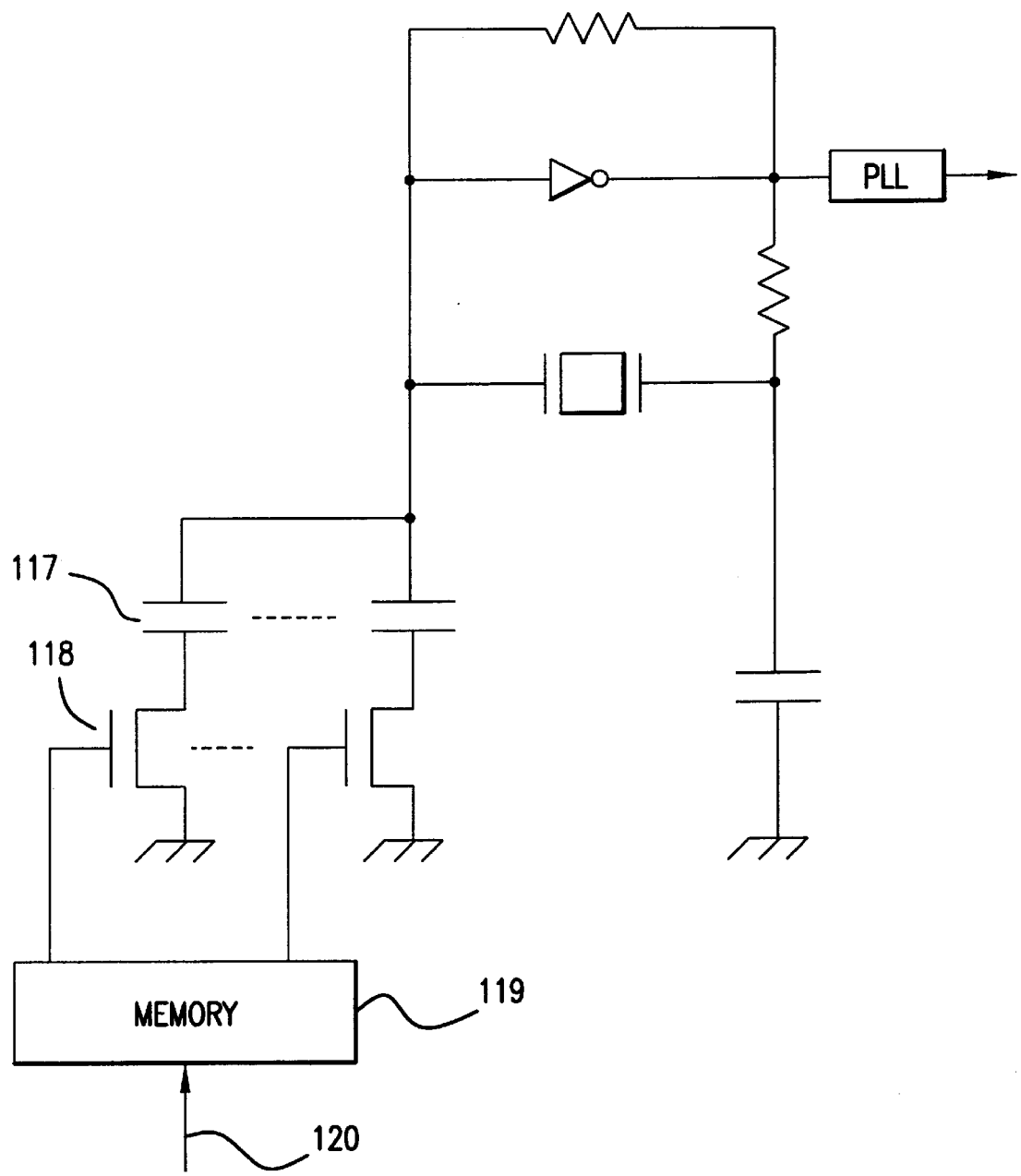
FIG. 17 is a circuit diagram of an oscillating circuit used to implement a PLL oscillator according to an embodiment of the invention.

FIG. 17 illustrates an embodiment based mainly on the aspect (35) described above. In this embodiment, a capacitor array formed on an IC chip is employed as the frequency adjustment capacitor.

The capacitor array refers to a set of two or more capacitors 117 having either equal capacitance values or different capacitance values wherein an arbitrary one of these capacitors can be selected by turning on or off a corresponding transistor 118. In accordance with the frequency of the reference signal for the PLL circuit, data is written into a memory 119 via a data input terminal 120. In accordance with the data stored in the memory 119, a capacitor 117 having an optimal capacitance value is selected from the capacitor array via a transistor 118. In this technique, a plurality of capacitors may also be selected from the capacitor arrays and they may be combined together to achieve finer frequency adjustment.

If the frequency adjustment for an overtone quartz oscillating circuit is performed using a capacitor array formed on an IC chip, a great area of the IC chip will be occupied by the capacitor array because a great capacitance value is required in the overtone oscillation as described earlier. This causes an increase in the cost of the IC. On the other hand, if the fundamental frequency mode is employed and frequency adjustment is performed at the fundamental frequency, the above problem can be avoided because the frequency adjustment for the fundamental frequency mode can be performed using a small capacitance value. In this case, the final output frequency is achieved using the PLL circuit at a frequency in the overtone frequency range, and the frequency adjustment can be performed using a capacitor having a small capacitance value.

In the present embodiment, as described above, since the oscillation signal in the fundamental frequency mode is used as the reference signal for the PLL circuit, the frequency adjustment can be performed over a wider range than can be by the overtone oscillation. This makes it possible to easily realize a high-accuracy oscillator with an inexpensive IC chip, capable of stably generating an output signal at a frequency in the overtone frequency range.

[Embodiment 16]

Figure 18:
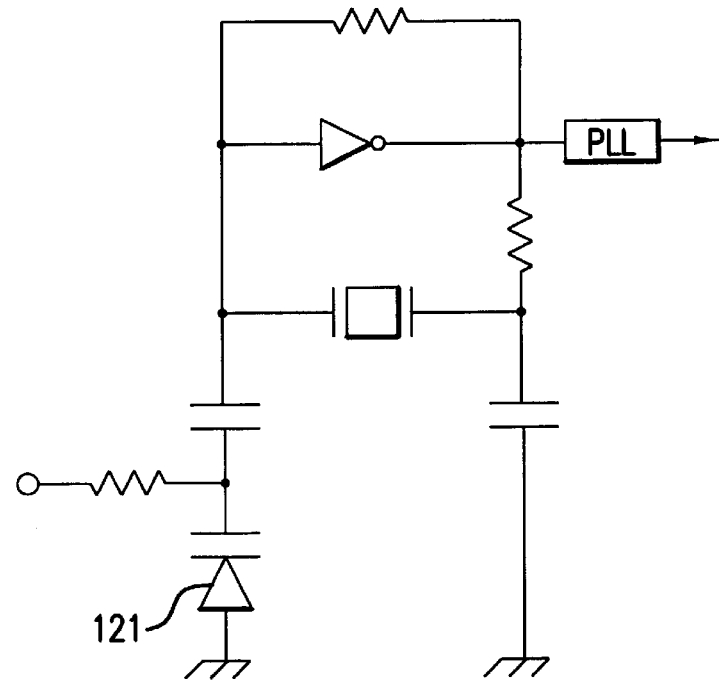
FIG. 18 is a circuit diagram of an oscillating circuit used to implement a PLL oscillator according to an embodiment of the invention.

FIG. 18 illustrates an embodiment based mainly on the aspect (37) of the invention. In this embodiment, a variable-capacitance diode is used as a variable capacitor for adjusting the frequency of the reference signal for the PLL circuit.

A variable-capacitance diode 121 is such a diode whose capacitance varies in response to the applied voltage. If the voltage applied across the variable-capacitance diode 121 is varied, a corresponding variation in the capacitance of the oscillating circuit occurs. As a result, the oscillation frequency varies. Thus, it is possible to control the oscillation frequency by controlling the voltage applied across the variable-capacitance diode 121. The operation is based on the same principle as that of a voltage controlled quartz oscillator (hereinafter referred to as a VCXO), wherein the PLL oscillator of the present embodiment has the feature that the frequency of the oscillation in the fundamental frequency mode is voltage-controlled, and the controlled oscillation signal is used as the reference signal for the PLL circuit thereby obtaining a signal having a multiplied frequency. In this embodiment, since a signal at a frequency in the overtone frequency range is generated by the VCXO in which a signal generated by the oscillation in the fundamental frequency mode is multiplied in frequency by the PLL circuit, it is possible to adjust the frequency over a wider range by varying the capacitance of the oscillating circuit than can be obtained with a VCXO whose output signal is directly generated by the overtone oscillation, by varying the capacitance by the same amount.

In the present embodiment, as described above, the reference signal applied to the PLL circuit is frequency-modulated so that the reference signal is multiplied in frequency. This technique makes it possible to realize a VCXO capable of outputting a signal at a high frequency in the overtone frequency range.

[Embodiment 17]

Figure 19:
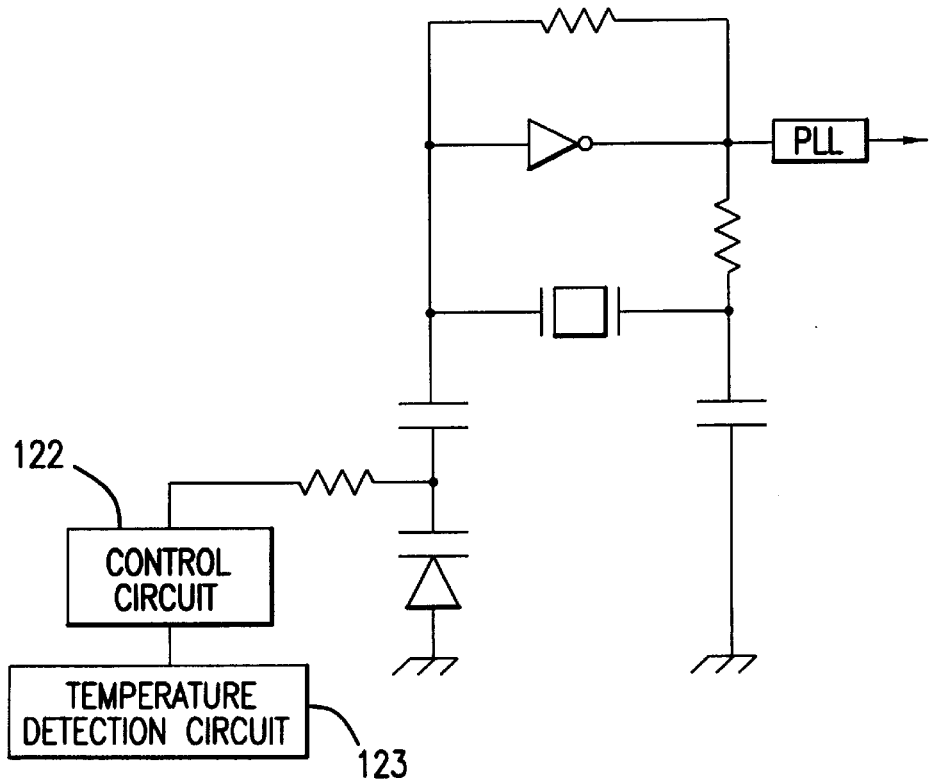
FIG. 19 is a circuit diagram of an oscillating circuit used to implement a PLL oscillator according to an embodiment of the invention.
Figure 20:
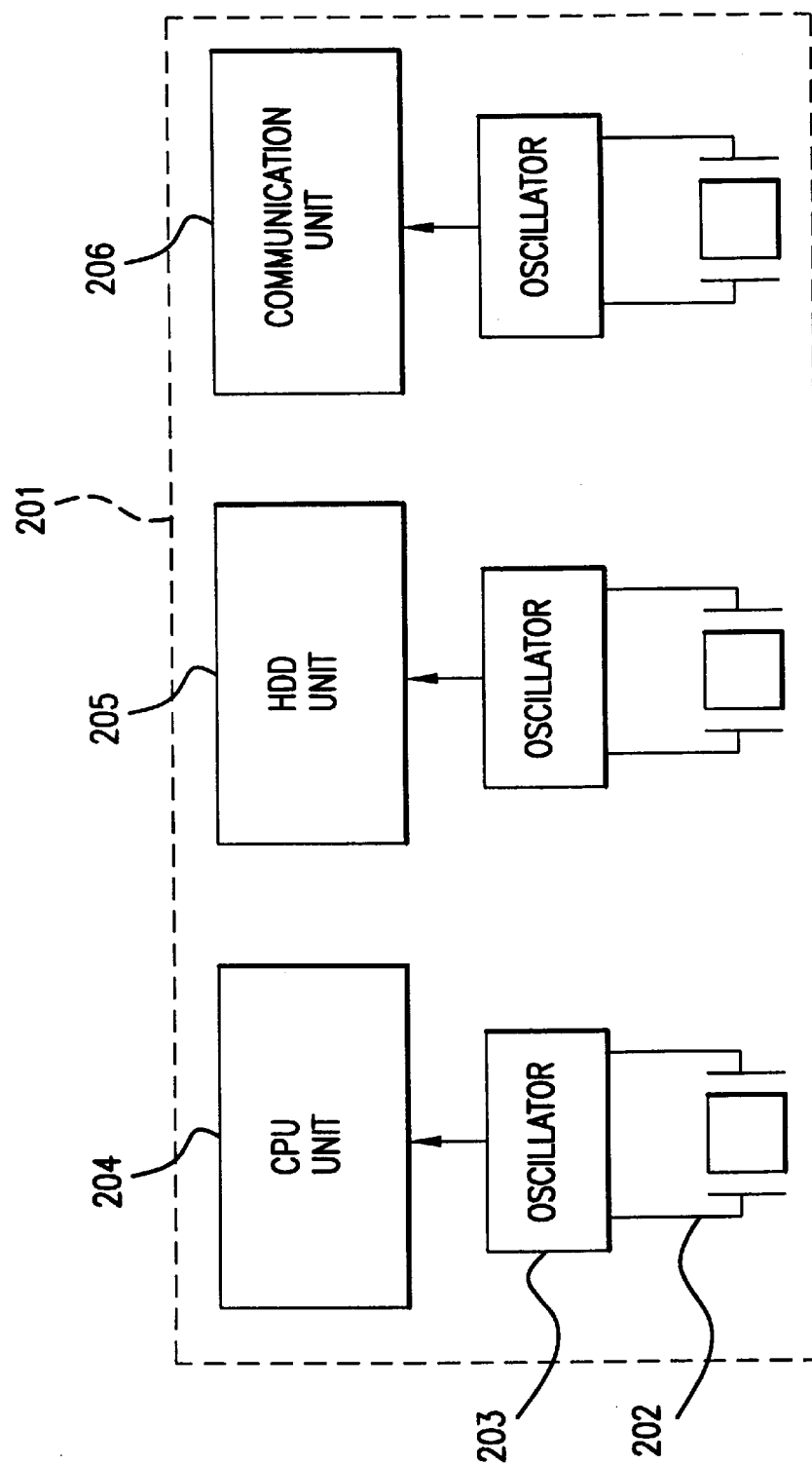
FIG. 20 is a block diagram illustrating a conventional technique.
Figure 21:
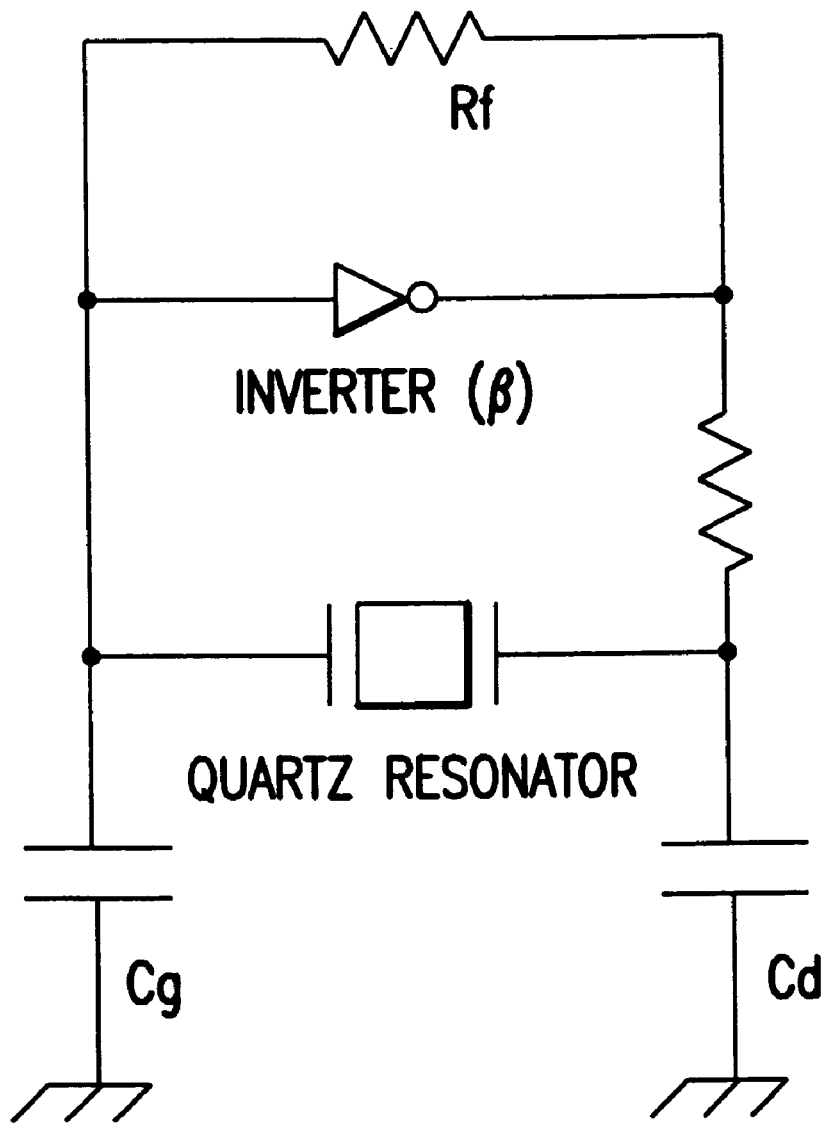
FIG. 21 is a block diagram illustrating a conventional technique.
Figure 22:
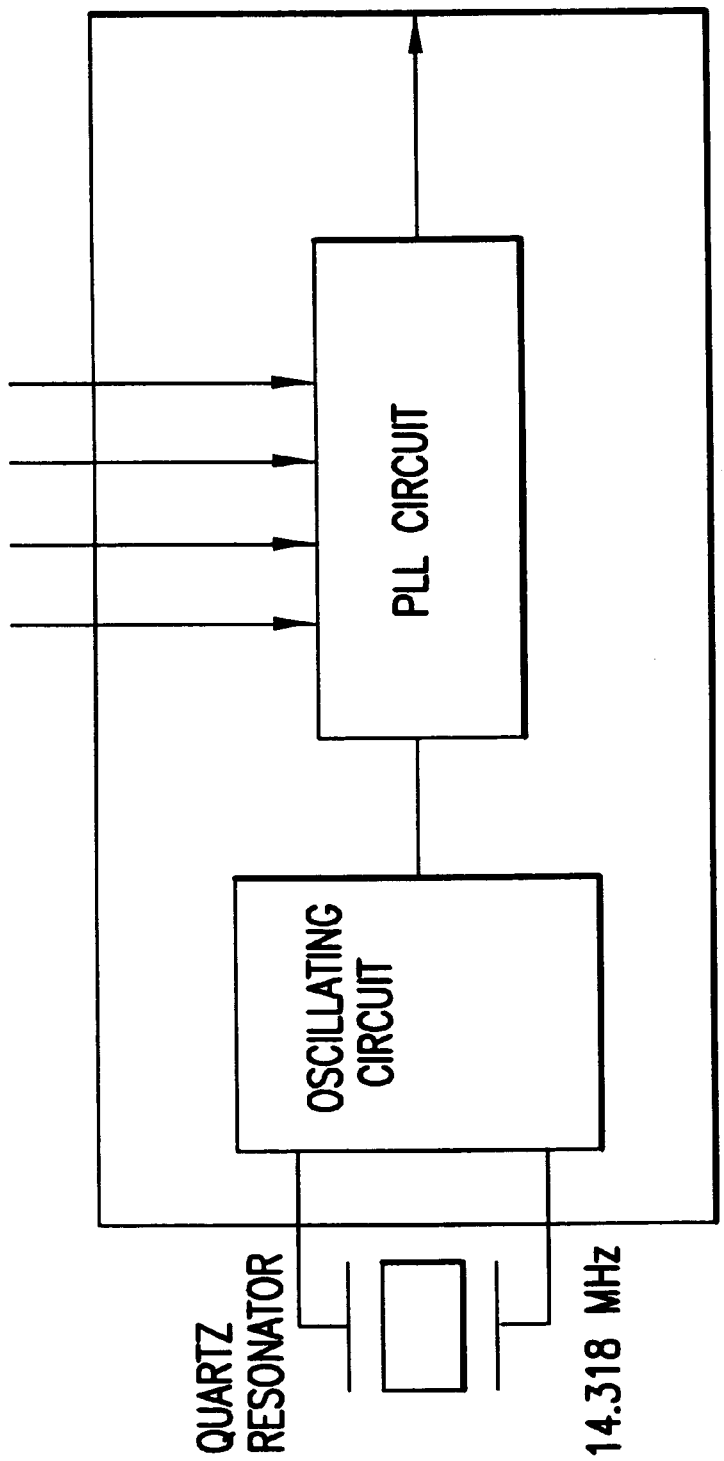
FIG. 22 is a functional block diagram illustrating a conventional technique.
Figure 23:
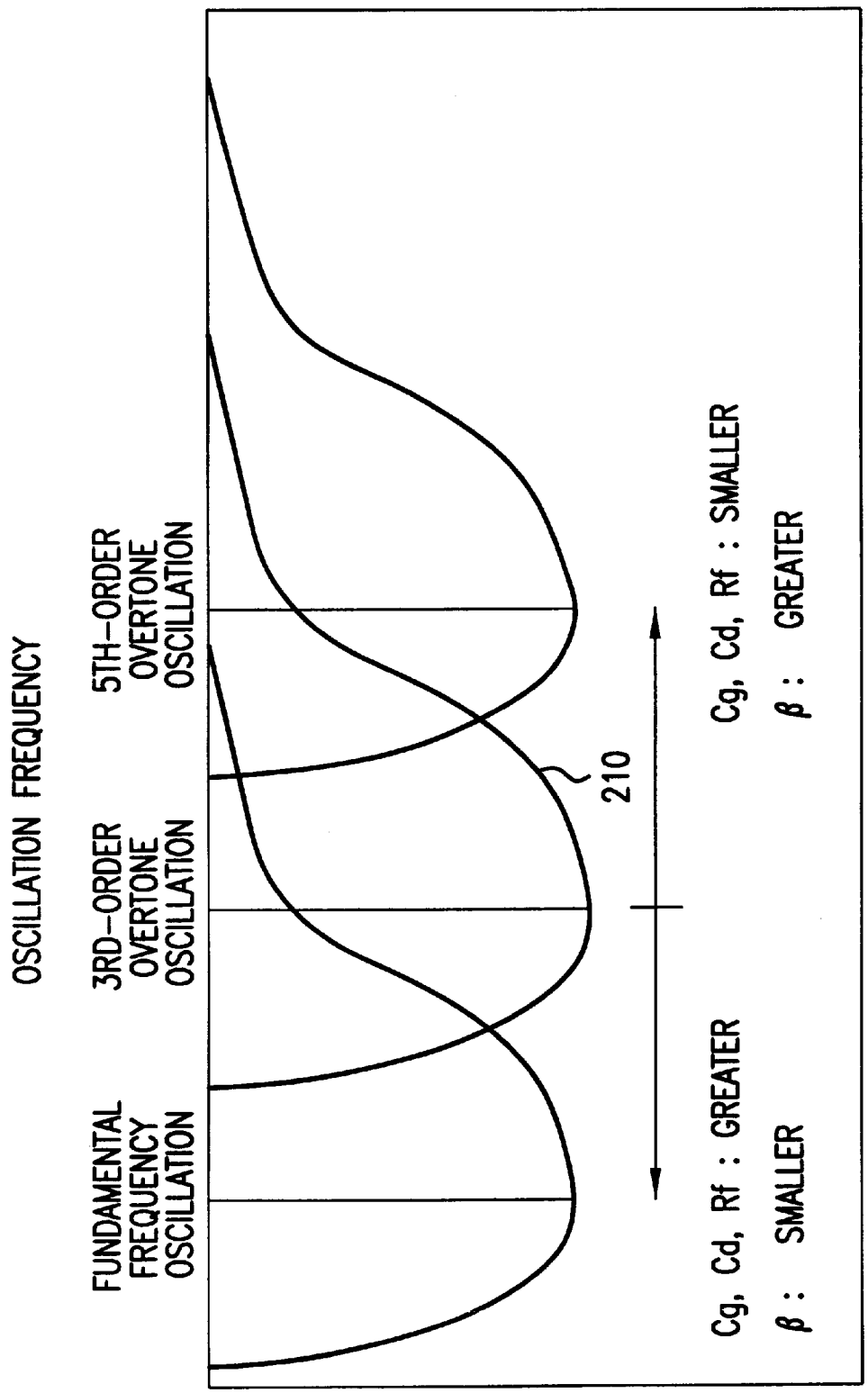
FIG. 23 is a graph illustrating the negative resistance versus frequency characteristic of a quartz oscillating circuit.

FIG. 19 illustrates an embodiment of a PLL circuit based mainly on the aspect (38) of the invention, wherein the load capacitance of a quartz oscillating circuit is controlled by a control circuit 122 in cooperation of a temperature detection circuit 123 so that the output frequency is maintained constant regardless of the change in temperature.

The ambient temperature is detected by the temperature detection circuit, and the detected temperature data is transmitted to the control circuit. In accordance to the temperature data received from the temperature detection circuit, the control circuit controls the voltage applied to a variable-capacitance diode so that the change in frequency with temperature is cancelled.

A change in oscillation frequency can occur since the resonance frequency of a quartz resonator varies with temperature. The change in the oscillation frequency with temperature is compensated for by controlling the load capacitor of the quartz oscillating circuit thereby stabilizing the output frequency regardless of the change in temperature.

In the PLL oscillator of the present embodiment, as described above, since the change in frequency of the output signal is suppressed, the PLL oscillator can be used as a stable signal source even in communication equipment used in outdoor environments where a large variation in temperature occurs.

Industrial Applicability

As described above, the PLL oscillator according to the invention has the feature that it can generate an output signal over a wide frequency range from a low frequency to a high frequency which is difficult to generate by the conventional overtone oscillation technique. The PLL oscillator of the invention can be used in a wide variety of applications such as information devices and systems, communication devices and systems, audio devices and systems, video devices and systems, home electrical apparatus, etc. Furthermore, the invention makes it possible to supply an oscillator for use at an arbitrary desired frequency in a short delivery time. This allows the oscillator of the invention to be used not only in general applications but also in special applications for particular customers.

What is claimed is:

1. A PLL oscillator comprising a piezoelectric resonator, an oscillating circuit for generating an oscillating signal in cooperation with said piezoelectric resonator, a phase locked loop circuit which operates using the oscillating signal generated by said oscillating circuit as a reference signal, and an output circuit for outputting the signal generated by said phase locked loop circuit, said piezoelectric resonator, said oscillating circuit, said phase locked loop circuit, and said output circuit being housed in a package, a frequency of an output signal of said PLL oscillator being determined by an oscillation frequency of said oscillating circuit and a frequency dividing ratio of a programmable frequency divider in said phase locked loop circuit, said PLL oscillator further comprising means for selecting the frequency dividing ratio of said programmable frequency divider so that said output frequency is set to a desired value, and means for stopping an operation of said oscillating circuit and/or switching said output circuit into a high-impedance state, said oscillating circuit, said phase locked loop circuit, and said output circuit being, included in an IC, a control pad for stopping the operation of said oscillating circuit and a control pad for switching said output circuit into a high-impedance state being, disposed oil said IC, and at least one of said two control pads being connected via a bonded-wire to one lead terminal having a portion extending outside said package.

2. A PLL oscillator according to claim 1, further comprising means for selecting the frequency dividing ratio of said programmable frequency divider and also for selecting a resonance frequency of said piezoelectric resonator so that said output frequency is set to a desired value.

3. A PLL oscillator comprising a piezoelectric resonator, an oscillating circuit for generating an oscillating signal in cooperation with said piezoelectric resonator, a phase locked loop circuit which operates using the oscillating signal generated by said oscillating circuit as a reference signal, said piezoelectric resonator, said oscillating circuit and said phase locked loop circuit being housed in a package, a frequency of an output signal of said PLL oscillator being determined by an oscillation frequency of said oscillating circuit and a frequency dividing ratio of a programmable frequency divider in said phase locked loop circuit, said PLL oscillator further comprising means for selecting the frequency dividing ratio of said programmable frequency divider so that said output frequency is set to a desired value wherein said phase locked loop circuit comprises a phase locked loop IC, further comprising a terminal serving as a frequency selection pad for selecting the frequency dividing ratio of said programmable frequency divider provided on said phase locked loop IC, and said frequency selection pad is selectively connected via a bonded-wire to either a power supply conductor or a ground level conductor provided in said package so that said output frequency is set to a desired value.

4. A PLL oscillator comprising a piezoelectric resonator, an oscillating circuit for generating an oscillating signal in cooperation with said piezoelectric resonator, a phase locked loop circuit which operates using the oscillating signal generated by said oscillating circuit as a reference signal, said piezoelectric resonator, said oscillating circuit and said phase locked loop circuit being housed in a package, a frequency of an output signal of said PLL oscillator being determined by an oscillation frequency of said oscillating circuit and a frequency dividing ratio of a programmable frequency divider in said phase locked loop circuit, said PLL oscillator further comprising means for selecting the frequency dividing ratio of said programmable frequency divider so that said output frequency is set to a desired value and a terminal serving as a frequency selection pad for selecting the frequency dividing ratio and said frequency selection pad is selectively connected via a bonded-wire to either a power supply conductor or a ground level conductor provided in said package so that said output frequency is set to the desired value, the connection between said frequency selection pad and said conductor provided in said package being selectively disconnected so that said output frequency is set to the desired value.

5. A PLL oscillator according to claim 1, wherein said phase locked loop circuit comprises a phase locked loop IC, further comprising a terminal serving as a frequency selection pad for selecting the frequency dividing ratio of said programmable frequency divider provided on said phase locked loop IC, and said frequency selection pad is connected via a bonded-wire to a lead terminal having a portion extending outside said package.

6. A PLL oscillator according to claim 5, wherein either one of two output frequencies is selected by controlling said frequency selection pad in which the ratio of the higher output frequency to the lower output frequency is within the range from 1.10 to 1.15.

7. A PLL oscillator according to claim 1, further comprising:

a frequency selection terminal for selecting the frequency dividing ratio of said programmable frequency divider; and a programmable read only memory for storing data by which a state of said frequency selection terminal is determined.

8. A PLL oscillator according to claim 7, wherein said phase locked loop circuit comprises a phase locked loop IC and wherein said frequency selection terminal has a portion extending outside said package, and said PLL oscillator further comprises means for writing data, by which a state of said frequency selection terminal is determined, into said programmable read only memory after placing said phase locked loop IC and said piezoelectric resonator into said package in a sealed fashion.

9. A PLL oscillator according to claim 1, further comprising a programmable read only memory for storing the frequency dividing ratio of said programmable frequency divider, and means for writing the frequency dividing ratio into said programmable read only memory.

10. A PLL oscillator according to claim 9, wherein said phase locked loop circuit comprises a phase locked loop IC, further comprising means for writing said frequency dividing ratio into said programmable read only memory after placing the phase locked loop IC including said phase locked loop circuit and said piezoelectric resonator in said package in a sealed fashion.

11. A PLL oscillator comprising a piezoelectric resonator, an oscillating circuit for generating an oscillating signal in cooperation with said piezoelectric resonator, a phase locked loop circuit which operates using the oscillating signal generated by said oscillating circuit as a reference signal, said piezoelectric resonator, said oscillating circuit and said phase locked loop circuit being housed in a package, a frequency of an output signal of said PLL oscillator being determined by an oscillation frequency of said oscillating circuit and a frequency dividing ratio of a programmable frequency divider in said phase locked loop circuit, said PLL oscillator further comprising means for selecting the frequency dividing ratio of said programmable frequency divider so that said output frequency is set to a desired value, and a terminal for writing said frequency dividing ratio disposed on a first side of said package, other terminals including an output enable terminal, a ground terminal, an output terminal and a power supply terminal not being disposed on said first side of said package.

12. A PLL oscillator according to claim 7, wherein said programmable read only memory is a fuse ROM.

13. A method of producing a PLL oscillator, comprising the steps of:

preparing said PLL oscillator including a piezoelectric resonator, an oscillating circuit for generating an oscillating signal in cooperation with said piezoelectric resonator, a phase locked loop circuit which operates using the oscillating signal provided from said oscillating circuit as a reference signal, an output circuit for outputting the signal generated by said phase locked loop circuit, a frequency selection terminal for selecting a frequency dividing ratio associated with a programmable frequency divider in said phase locked loop circuit, a programmable read only memory for storing data by which a state of said frequency selection terminal is determined, and writing means for writing said data, said piezoelectric resonator, said oscillating circuit, said phase locked loop circuit, said output circuit, said frequency selection terminal, said programmable read only memory and said writing means being placed in a sealed package, said frequency selection terminal having a portion extending outside said package, said PLL oscillator further comprising means for stopping an operation of said oscillating circuit and/or switching said output circuit into a high-impedance state, and said oscillating circuit, said phase locked loop circuit, and said output circuit being included in an IC, a control pad for stopping the operation of said oscillating circuit and a control pad for switching said output circuit into a high-impedance state being disposed on said IC, and at least one of said two control pads being connected via a bonded-wire to one lead terminal having a portion extending outside said package; and cutting off said frequency selection terminal after writing said data into said programmable read only memory.

14. A method of producing a PLL oscillator, comprising the steps of:

preparing said PLL oscillator including a piezoelectric resonator, an oscillating circuit for generating an oscillating signal in cooperation with said piezoelectric resonator, a phase locked loop circuit which operates using the oscillating signal provided from said oscillating circuit as a reference signal, an output circuit for outputting the signal generated by said phase locked loop circuit, a programmable read only memory for storing a frequency dividing ratio of a programmable frequency divider in said phase locked loop circuit, and writing means for writing said frequency dividing ratio into said programmable read only memory, said piezoelectric resonator, said oscillating circuit, said phase locked loop circuit, said output circuit, said programmable read only memory and said writing means being placed in a scaled package, said PLL oscillator further including a writing terminal for writing said for writing terminal having a portion extending outside said package, and means for stopping an operation of said oscillating circuit and/or switching said output circuit into a high-impedance state, said oscillating circuit, said phase locked loop circuit, and said output circuit being included in an IC, a control pad for stopping the operation of said oscillating circuit and a control pad for switching said output circuit into a high-impedance state being disposed on said IC, and at least one of said two control pads being connected via a bonded-wire to one lead terminal having a portion extending outside said package; and writing said frequency dividing ratio into said programmable read only memory via said writing terminal.

15. A method of producing a PLL oscillator, according to claim 14, wherein said writing terminal is cut off after writing said frequency dividing ratio into said programmable read only memory.

16. A method of producing a PLL oscillator, according to claim 14, wherein after cutting off said writing terminal, a probe is placed such that it comes into contact with the cut surface of said writing terminal thereby writing said frequency dividing ratio into said programmable read only memory.

17. A method of producing a PLL oscillator, comprising the steps of placing into a package in a sealed fashion components including a piezoelectric resonator, an oscillating circuit for generating an oscillating signal in cooperation with said piezoelectric resonator, a phase locked loop circuit which operates using the oscillating signal provided from said oscillating circuit as a reference signal, an output circuit for outputting the signal generated by said phase locked loop circuit, a programmable read only memory for storing the frequency dividing ratio of a programmable frequency divider in said phase locked loop circuit, and means for writing said frequency dividing ratio into said programmable read only memory, wherein the sealing of said package is performed in such a manner that said components are molded with a resin by injecting said resin into a mold from a first side of said package different from a second side of said package through which a writing terminal for writing said frequency dividing ratio extends outside said package, said PLL oscillator further comprising means for stopping an operation of said oscillating circuit and/or switching said output circuit into a high-impedance state, said oscillating circuit, said phase locked loop circuit, and said output circuit being included in an IC, a control pad for stopping the operation of said oscillating circuit and a control pad for switching said output circuit into a high-impedance state being disposed on said IC, and at least one of said two control pads being connected via a bonded-wire to one lead terminal having a portion extending outside said package.

18. A method of producing a PLL oscillator, comprising the steps of:

placing into a package components including a piezoelectric resonator, an oscillating circuit for generating an oscillating signal in cooperation with said piezoelectric resonator, a phase locked loop circuit which operates using the oscillating signal provided from said oscillating circuit, and an output circuit for outputting the signal generated by said phase locked loop circuit, said PLL oscillator further comprising means for stopping an operation of said oscillating circuit and/or switching said output circuit into a high-impedance state, said oscillating circuit, said phase locked loop circuit, and said output circuit being included in an IC, a control pad for stopping the operation of said oscillating circuit and a control pad for switching said output circuit into a high-impedance state being disposed on said IC, and at least one of said two control pads being connected via a bonded-wire to one lead terminal having a portion extending outside said package;

after placing said components into said package, adjusting a resonance frequency of said piezoelectric resonator; and sealing said package.

19. A PLL oscillator comprising a piezoelectric resonator, an oscillating circuit, a phase locked loop circuit which operates using an oscillation signal provided from said oscillating circuit as a reference signal, and an output circuit for outputting the signal generated by said phase locked loop circuit, said piezoelectric resonator, said oscillating circuit, said phase locked loop circuit and said output circuit being placed in a sealed package, the output frequency of said PLL oscillator being determined by a resonance frequency of said piezoelectric resonator and also by a frequency dividing ratio of a programmable frequency divider in said phase locked loop circuit, said PLL oscillator further comprising means for selecting the frequency dividing ratio of said programmable frequency divider so that said output frequency is set to a desired value, said PLL oscillator further comprising means for stopping an operation of said oscillating circuit and/or switching said output circuit into a high-impedance state, said oscillating circuit, said phase locked loop circuit, and said output circuit are included in an IC, and a control pad for stopping the operation of said oscillating circuit and a control pad for switching said output circuit into a high-impedance state are disposed on said IC, at least one of said two control pads being connected via a bonded-wire to one lead terminal having a portion extending outside said package.

20. A PLL oscillator according to claim 19, further comprising means for selecting the frequency dividing ratio of said programmable frequency divider and also for selecting the resonance frequency of said piezoelectric resonator so that said output frequency is set to a desired value.

21. A PLL oscillator comprising a tuning fork type piezoelectric resonator, an oscillating circuit, a phase locked loop circuit which operates using an oscillation signal provided from said oscillating circuit as a reference signal, an output circuit for outputting the signal generated by said phase locked loop circuit, said piezoelectric resonator, said oscillating circuit, said phase locked loop circuit and said output circuit being placed in a sealed package, said PLL oscillator having a standby capability for stopping an operation of said oscillating circuit and an operation of said output circuit wherein when said standby capability is enabled, only said oscillating circuit is operated.

22. A PLL oscillator according to claim 21, wherein an output frequency of said PLL oscillator is determined by a resonance frequency of said tuning fork type piezoelectric resonator and a frequency dividing ratio of a programmable frequency divider in said phase locked loop circuit, and said PLL oscillator further comprises means for selecting the frequency dividing ratio of said programmable frequency divider so that said output frequency is set to a desired value.

23. A PLL oscillator according to claim 21, wherein an output frequency of said PLL oscillator is determined by a resonance frequency of said tuning fork type piezoelectric resonator and a frequency dividing ratio of a programmable frequency divider in said phase locked loop circuit, and said PLL oscillator further comprises means for selecting the frequency dividing ratio of said programmable frequency divider and for selecting the resonance frequency of said tuning fork type piezoelectric resonator so that said output frequency is set to a desired value.

24. A PLL oscillator comprising a piezoelectric resonator, an oscillating circuit for generating an oscillating signal in cooperation with said piezoelectric resonator, and a phase locked loop circuit which operates using the oscillation signal provided from said oscillating circuit as a reference signal, said phase locked loop circuit comprising an IC, said phase locked loop circuit including a low-pass filter having an element disposed outside the IC, said element being placed in a sealed package together with said piezoelectric resonator, said oscillating circuit, and said phase locked loop circuit, said package being a ceramic package, and a resistor of said low-pass filter being formed on a substrate of said ceramic package.

25. A PLL oscillator according to claim 24, wherein an output frequency of said PLL oscillator is determined by a resonance frequency of said piezoelectric resonator and also by a frequency dividing ratio of a programmable frequency divider in said phase locked loop circuit, and said PLL oscillator further comprises means for selecting the frequency dividing ratio of said programmable frequency divider so that said output frequency is set to a desired value.

26. A PLL oscillator according to claim 24, wherein an output frequency of said PLL oscillator is determined by a resonance frequency of said piezoelectric resonator and also by a frequency dividing ratio of a programmable frequency divider in said phase locked loop circuit, and said PLL oscillator further comprises means for selecting the frequency dividing ratio of said programmable frequency divider and also for selecting the resonance frequency of said piezoelectric resonator so that said output frequency is set to a desired value.

27. A PLL oscillator comprising a piezoelectric resonator, an oscillating circuit for generating an oscillating signal in cooperation with said piezoelectric resonator, and a phase locked loop circuit which operates using the oscillating signal provided from said oscillating circuit as a reference signal, said phase locked loop circuit comprising an IC, said phase locked loop circuit including a low-pass filter having an element disposed outside the IC, said element being placed in a sealed package together with said piezoelectric resonator, said oscillating circuit, and said phase locked loop circuit, wherein said package is a ceramic package, and a capacitor of said low-pass filter is formed on a substrate of said ceramic package.

28. A PLL oscillator comprising a piezoelectric resonator, an oscillating circuit for generating an oscillating signal in cooperation with said piezoelectric resonator, and a phase locked loop circuit which operates using the oscillating signal provided from said oscillating circuit as a reference signal, said phase locked loop circuit comprising an IC, said phase locked loop circuit including a low-pass filter having an element disposed outside the IC, said element being placed in a sealed package together with said piezoelectric resonator, said oscillating circuit, and said phase locked loop circuit, said package being a ceramic package, and a capacitor of said low-pass filter being formed on a substrate of said ceramic package, and one electrode of said capacitor being formed using a stage on which the IC including said phase locked loop circuit is mounted.

29. A PLL oscillator comprising a piezoelectric resonator, an oscillating circuit for generating an oscillating signal in cooperation with said piezoelectric resonator, a phase locked loop circuit which operates using the oscillating signal provided from said oscillating circuit as a reference signal, and an output circuit for outputting the signal generated by said phase locked loop circuit, said piezoelectric resonator, said oscillating circuit, said phase locked loop circuit and said output circuit being placed in a sealed package, said PLL oscillator further comprising, means for stopping an operation of said oscillating circuit and/or switching said output circuit into a high-impedance state, said oscillating circuit, said phase locked loop circuit, and said output circuit being included in an IC, a control pad for stopping the operation of said oscillating circuit and a control pad for switching said output circuit into a high-impedance state being disposed on said IC, and at least one of said two control pads being connected via a bonded-wire to one lead terminal having a portion extending outside said package, said oscillating circuit including means with a variable capacitor for adjusting an oscillation frequency of said oscillating circuit.

30. A PLL oscillator according to claim 29, wherein an output frequency of said PLL oscillator is determined by a resonance frequency of said piezoelectric resonator and also by a frequency dividing ratio of a programmable frequency divider in said phase locked loop circuit, and said PLL oscillator further comprises means for selecting the frequency dividing ratio of said programmable frequency divider so that said output frequency is set to a desired value.

31. A PLL oscillator according to claim 29, wherein an output frequency of said PLL oscillator is determined by a resonance frequency of said piezoelectric resonator and also by a frequency dividing ratio of a programmable frequency divider in said phase locked loop circuit, and said PLL oscillator further comprising means for selecting the frequency dividing ratio of said programmable frequency divider and also for selecting the resonance frequency of said piezoelectric resonator so that said output frequency is set to a desired value.

32. A PLL oscillator according to claim 29, wherein said variable capacitor is a capacitor array.

33. A PLL oscillator according to claim 32, further comprising a programmable read only memory for storing control data for controlling said capacitor array, and means for writing data into said programmable read only memory after the package is sealed.

34. A PLL oscillator according to claim 29, wherein said variable capacitor is a variable-capacitance diode.

35. A PLL oscillator according to claim 29, wherein said variable capacitor is controlled by a control circuit having a temperature detection capability.

36. A method of producing a PLL oscillator, comprising the steps of:

preparing a PLL oscillator including a piezoelectric resonator, an oscillating circuit for generating an oscillating signal in cooperation with said piezoelectric resonator, a phase locked loop circuit which operates using the oscillating signal provided from said oscillating circuit as a reference signal, an output circuit for outputting the signal generated by said phase locked loop circuit, adjusting means for adjusting an oscillation frequency of said oscillating circuit with a capacitor array included in said oscillating circuit, and a fuse ROM for storing control data for controlling said capacitor array, said piezoelectric resonator, said oscillating circuit, said phase locked loop circuit, said output circuit, said adjusting means and said fuse ROM being placed in a sealed package, said PLL oscillator further including means for writing said control data into said fuse ROM after said package is sealed, and a writing terminal via which said control data is written, said writing terminal having a portion extending outside said package, and means for stopping an operation of said oscillating circuit and/or switching said output circuit into a high-impedance state, said oscillating circuit, said phase locked loop circuit, and said output circuit being included in an IC, a control pad for stopping the operation of said oscillating circuit and a control pad for switching said output circuit into a high-impedance state being disposed on said IC, and at least one of said two control pads being connected via a bonded-wire to one lead terminal having a portion extending outside said package; and cutting off said writing terminal after writing said control data.

* * * * *